United States Patent
Hamilton et al.

(10) Patent No.: US 8,000,127 B2
(45) Date of Patent: Aug. 16, 2011

(54) METHOD FOR RESETTING A RESISTIVE CHANGE MEMORY ELEMENT

(75) Inventors: Darlene Hamilton, Lacey, WA (US); Rinn Cleavelin, Dallas, TX (US)

(73) Assignee: Nantero, Inc., Woburn, MA (US)

( * ) Notice: Subject to any disclaimer, the term of this patent is extended or adjusted under 35 U.S.C. 154(b) by 118 days.

(21) Appl. No.: 12/618,448

(22) Filed: Nov. 13, 2009

(65) Prior Publication Data
US 2011/0038195 A1   Feb. 17, 2011

Related U.S. Application Data

(60) Provisional application No. 61/233,474, filed on Aug. 12, 2009.

(51) Int. Cl.
*G11C 11/00* (2006.01)
*G11C 17/00* (2006.01)
(52) U.S. Cl. .................. 365/148; 365/100; 365/163
(58) Field of Classification Search .............. 365/148
See application file for complete search history.

(56) References Cited

U.S. PATENT DOCUMENTS

| | | |
|---|---|---|
| 6,422,450 B1 | 7/2002 | Zhou et al. |
| 6,423,583 B1 | 7/2002 | Avouris et al. |
| 6,528,020 B1 | 3/2003 | Dai et al. |
| 6,808,746 B1 | 10/2004 | Dai et al. |
| 6,888,773 B2 | 5/2005 | Morimoto |
| 6,890,780 B2 | 5/2005 | Lee |
| 6,894,359 B2 | 5/2005 | Bradley et al. |
| 6,899,945 B2 | 5/2005 | Smalley et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 7,015,500 B2 | 3/2006 | Choi et al. |
| 7,161,403 B2 | 1/2007 | Bertin |
| 7,382,647 B1 * | 6/2008 | Gopalakrishnan ............ 365/163 |
| 7,826,248 B2 * | 11/2010 | Xi et al. ....................... 365/148 |
| 7,924,601 B2 * | 4/2011 | Aoki ............................. 365/148 |
| 2002/0175390 A1 | 11/2002 | Goldstein et al. |
| 2004/0031975 A1 | 2/2004 | Kern et al. |

(Continued)

OTHER PUBLICATIONS

Avouris, P., et al., "Carbon Nanotube Electronics," Chemical Physics, 2002, vol. 284, pp. 429-445.

(Continued)

*Primary Examiner* — Son L Mai
(74) *Attorney, Agent, or Firm* — Wilmer Cutler Pickering Hale and Dorr LLP

(57) ABSTRACT

A method of resetting a resistive change memory element is disclosed. The method comprises performing a series of programming operations—for example, a programming pulse of a predetermined voltage level and pulse width—on a resistive change memory element in order to incrementally increase the resistance of the memory element above some predefined threshold. Prior to each programming operation, the resistive state of the memory element is measured and used to determine the parameters used in that programming operation. If this measured resistance value is above a first threshold value, the memory element is determined to already be in a reset state and no further programming operation is performed. If this measured resistance value is below a second threshold value, this second threshold value being less than the first threshold value, a first set of programming parameters are used within the programming operation. If this initial value is above the second threshold value but below the first threshold value, a second set of programming parameters are used within the programming operation.

21 Claims, 10 Drawing Sheets

U.S. PATENT DOCUMENTS

| | | | |
|---|---|---|---|
| 2004/0132070 A1 | 7/2004 | Star et al. | |
| 2004/0266106 A1 | 12/2004 | Lee | |
| 2005/0212014 A1 | 9/2005 | Horibe et al. | |
| 2006/0203542 A1* | 9/2006 | Kurotsuchi et al. | 365/163 |
| 2006/0250843 A1 | 11/2006 | Bertin et al. | |
| 2006/0250856 A1 | 11/2006 | Bertin et al. | |
| 2006/0258122 A1 | 11/2006 | Whitefield et al. | |
| 2006/0264053 A1 | 11/2006 | Yates | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2007/0195590 A1* | 8/2007 | Sugita | 365/163 |
| 2008/0012047 A1 | 1/2008 | Bertin et al. | |
| 2008/0142850 A1 | 6/2008 | Bertin et al. | |
| 2008/0157126 A1 | 7/2008 | Bertin et al. | |
| 2008/0159042 A1 | 7/2008 | Bertin et al. | |
| 2008/0266933 A1* | 10/2008 | Chen et al. | 365/148 |
| 2009/0225583 A1* | 9/2009 | Lee et al. | 365/148 |
| 2010/0027315 A1* | 2/2010 | Kim | 365/148 |
| 2010/0091551 A1* | 4/2010 | Hosono et al. | 365/148 |
| 2011/0051497 A1* | 3/2011 | Kim et al. | 365/148 |

OTHER PUBLICATIONS

Awano, Y., "Graphene for VLSI: FET and Interconnect Applications" IEDM 2009 Technical Digest, pp. 10.1.1-10.1.4.

Brown, K.M. "System in package "The Rebirth of SIP"," 2004 IEEE Custom Integrated Circuits Conference, May 2004.

Collins, P. G. et al., "Engineering Carbon Nanotubes and Nanotube Circuits Using Electrical Breakdown", Science, vol. 292, pp. 706-709, Apr. 27, 2001.

Crowley, M. et al., "512 Mb PROM with 8 layers of antifuse/Diode cells," IEEE International Solid-State Circuits Conference, vol. XLVI, pp. 284-285, Feb. 2003.

Cui, J.B. et al., "Carbon nanotube memory devices of high charge storage stability," Applied Physics Letters, vol. 81, No. 17, Oct. 21, 2002, pp. 3260-3262.

Derycke, V., et al., "Carbon Nanotube Inter- and Intramolecular Logic Gates," Nano Letters, Sep. 2001, vol. 1, No. 9, pp. 453-456.

Fuhrer, M.S. et al., "High-Mobility Nanotube Transistor Memory," Nano Letters, 2002, vol. 2, No. 7, pp. 755-759.

Hone, J., "Phonons and Thermal Properties of Carbon Nanotubes", Carbon Nanotubes, Topics Appl. Phys., vol. 80, pp. 273-286, 2001.

Huai, Y. "Spin-Transfer Torque MRAM (STT-MTAM): Challenges and Prospects" AAPS Bulletin Dec. 2008, vol. 18, No. 6, pp. 33-40.

Jiang, Y. et al., "Performance Breakthrough in 8nm Gate-All-Around Length Gate-All-Around Nanowire Transistors using Metallic Nanowire Contacts" 2008 Symposium on VLSI Technology Digest of Technical Papers, pp. 34-35.

Johnson, R. Colin, "IBM fellow unrolls blueprint for nano", EETimes, Mar. 6, 2006, 3 pages, http://www.eetimes.com/showArticle.jhtml?articleID=181500304.

Kianian, S. et al., "A 3D Stackable Carbon Nanotube-based Nonvolatile Memory (NRAM)," ESSDERC, Jun. 14, 2010, Nantero, Inc.

Kong, J. et al., "Quantum Interference and Ballistic Transmission in Nanotube Electron Waveguides", The American Physical Society, vol. 87, No. 10, pp. 106801-1-106801-4, Sep. 3, 2001.

Langer, L. et al., "Electrical Resistance of a Carbon Nanotube Bundle," J. Mater. Res. vol. 9, No. 4, Apr. 1994, 6 pages.

Novak, J.P. et al., "Nerve agent detection using networks of single-walled carbon nanotubes," Applied Physics Letters, vol. 83, No. 19, Nov. 10, 2003, pp. 4026-4028.

Onoa et al., "Bulk Production of singly dispersed carbon nanotubes with prescriped lengths", Nanotechnology, vol. 16, pp. 2799-2803, 2005.

Rueckes, T., et al., "Carbon Nanotube-Based Nonvolatile Random Access Memory for Molecular Computing," Science, Jul. 7, 2000, vol. 289, pp. 94-97.

Servalli, G. "A 45nm Generation Phase Change Memory Technology," IEDM 2009 Technical Digest, pp. 5.7.1-5.7.4.

Snow, E.S. et al., "Random networks of carbon nanotubes as an electronic material," Applied Physics Letters, vol. 82, No. 13, Mar. 31, 2003, pp. 2145-2147.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

* cited by examiner

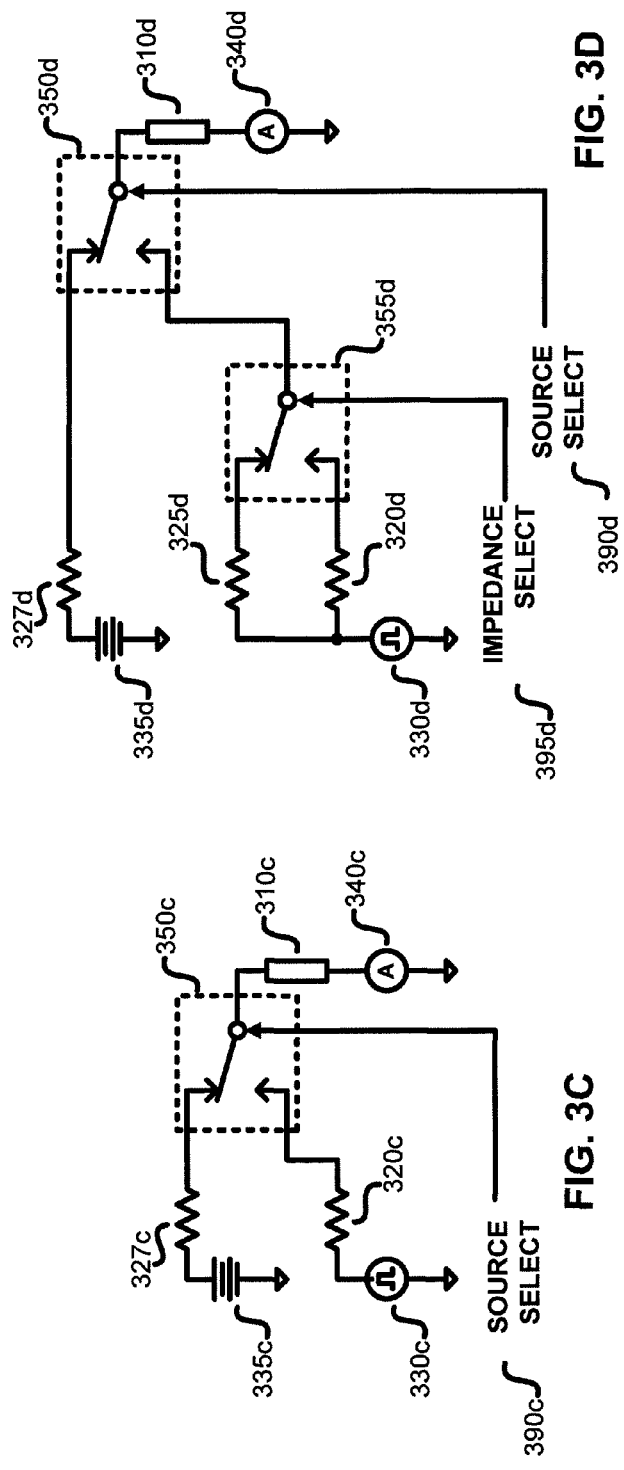
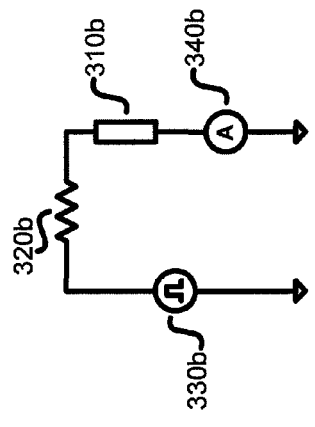
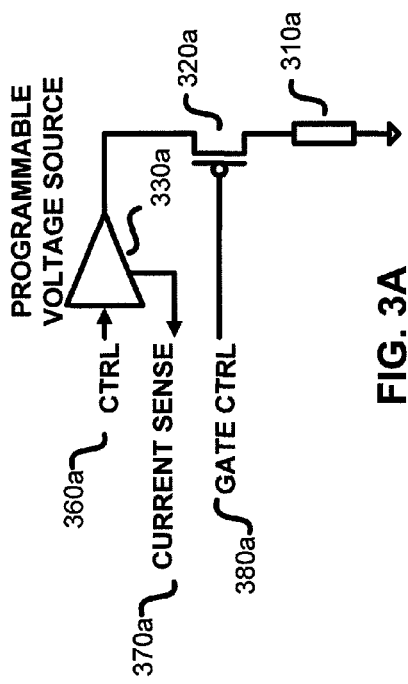
FIG. 3A
FIG. 3B
FIG. 3C
FIG. 3D

METHOD FOR RESETTING A RESISTIVE CHANGE MEMORY ELEMENT

CROSS-REFERENCE OF RELATED CASES

This application claims the benefit under 35 U.S.C. §119(e) of U.S. Provisional Patent Application No. 61/233,474, filed on Aug. 12, 2009, entitled METHOD FOR RESETTING A RESISTIVE CHANGE MEMORY ELEMENT, the contents of which are hereby incorporated by reference in their entirety.

This application is related to the following U.S. patents, which are assigned to the assignee of the present application, and are hereby incorporated by reference in their entirety:

- U.S. Pat. No. 6,835,591, filed on Apr. 23, 2002, entitled Methods of Nanotube Films and Articles;
- U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;
- U.S. Pat. No. 6,706,402, filed on Mar. 16, 2004, entitled Nanotube Films and Articles;
- U.S. Pat. No. 7,115,901, filed on Jun. 9, 2004, entitled Non-Volatile Electromechanical Field Effect Devices and Circuits Using Same and Methods of Forming Same; and
- U.S. Pat. No. 7,365,632, filed on Sep. 20, 2005, entitled Resistive Elements Using Carbon Nanotubes.

This application is related to the following U.S. patent applications, which are assigned to the assignee of the application, and are hereby incorporated by reference in their entirety:

- U.S. patent application Ser. No. 11/280,786, filed on Nov. 15, 2005, entitled Two-Terminal Nanotube Devices and Systems and Methods of Making Same;
- U.S. patent application Ser. No. 11/398,126, filed on Apr. 5, 2006, entitled Nanotube Articles with Adjustable Electrical Conductivity and Methods of Making Same;
- U.S. patent application Ser. No. 11/835,856, filed on Aug. 8, 2008, entitled Nonvolatile Nanotube Diodes and Nonvolatile Nanotube Blocks and Systems Using Same and Methods of Making Same; and
- U.S. patent application Ser. No. 12/536,803, filed on Aug. 6, 2009, entitled Nonvolatile Nanotube Programmable Logic Devices and a Nonvolatile Nanotube Field Programmable Gate Array Using Same.

BACKGROUND

1. Technical Field

The present invention relates generally to resistive change memory elements, and, more specifically, to a method of resetting resistive change memory elements wherein the memory elements are prevented from entering an unrecoverable high resistive state.

2. Discussion of Related Art

Any discussion of the related art throughout this specification should in no way be considered as an admission that such art is widely known or forms part of the common general knowledge in the field.

Resistive change memory devices and arrays, often referred to as resistance RAMs by those skilled in the art, are well known in the semiconductor industry. Such devices and arrays include, but are not limited to, phase change memory, solid electrolyte memory, metal oxide resistance memory, and carbon nanotube memory such as NRAM™.

Resistive change memory devices and arrays store information by adjusting a resistive change memory element, typically comprising some material that can be adjusted between a number of non-volatile resistive states in response to some applied stimuli, within each individual memory cell between two or more resistive states. For example, each resistive state within a resistive change memory cell can correspond to a data value which can be programmed and read back by supporting circuitry within the device or array.

For example, a resistive memory change element might be arranged to switch between two resistive states: a high resistive state (which might correspond to a logic "0") and a low resistive state (which might correspond to a logic "1"). In this way, a resistive change memory element can be used to store one binary digit (bit) of data.

Within the current state of the art, there is an increasing need to reliably and rapidly control the switching of resistive change memory elements as they are adjusted from one resistive state to another. Specifically, there is a need to control the adjustment of a resistive change memory element from a low resistive state to a high resistive state, typically referred to as a "reset" operation by those skilled in the art, such that the resistive change memory element does not enter a very low resistive state, essentially an undesired set state inadvertently triggered during the reset operation, which, in certain applications, may represent an unrecoverable condition.

To this end, it would be advantageous if a programming method would perform a reset operation (a transition from a low resistive state to a high resistive state) on a resistive change memory element while guarding against driving the resistive change memory element into a very low and potentially unrecoverable state.

SUMMARY

The current invention relates to methods of resetting a resistive change memory element and, more specifically, to a method for resetting a resistive change memory element which guards against driving the memory element into a very low and potentially unrecoverable resistive state.

In particular, the present invention provides a method of resetting a resistive change memory element. The method comprises measuring a current through the resistive change memory element and comparing the current through the resistive change memory element with at least one of a first and a second current threshold values, wherein the first and second current threshold values define a first, second, and third current ranges. Further, the method comprises applying stimulus to the resistive change memory element, wherein the stimulus is determined by a first set of programming parameters when the current through the resistive change memory element is within the first current range, and wherein the stimulus is determined by a second set of programming parameters when the current through the resistive change memory element is within the second current range. The method further comprises repeating the steps of measuring, comparing, and applying until the current through the resistive change memory element is within the third current range.

In one aspect of the present invention provides a method of resetting a resistive change memory element. The method first comprises measuring the resistance of the resistive change memory element to determine a stored resistance value. The method further comprises comparing this stored resistance value against at least one resistance threshold value to select a set of programming parameters. The method further comprises performing a programming operation on the resistive change memory element using the selected set of programming parameters. The method further comprises repeating the steps of measuring, comparing, and performing until the resistive change memory element enters a valid reset state.

In one aspect of the present disclosure the stored resistance value is measured by applying a test voltage across the resistive change memory element and measuring the current drawn by the resistive change memory element.

In another aspect of the present disclosure the stored resistance value is measured by driving a test current through the resistive change memory element and measuring the resulting voltage across the resistive change memory element.

In another aspect of the present disclosure the stored resistance value is measured using an ammeter connected in series with the resistive change memory element.

In another aspect of the present disclosure two resistance threshold values define a first range of resistance values, a second range of resistance values, and a third range of resistance values. A first set of programming parameters are selected if the stored resistance value is within the first range of resistance values, and a second set of programming parameters are selected if the stored resistance value is within the second range of resistance values. The resistive change memory element is determined to be in a valid reset state if the stored resistance value is within the third range of resistance values.

In another aspect of the present disclosure the selected programming parameters include at least one of the following parameters: voltage level, pulse width, rise time, fall time, series resistance, and supply current.

In another aspect of the present disclosure the method is executed and controlled by a software program.

In another aspect of the present disclosure the method is executed and controlled by a hardware circuit.

In another aspect of the present disclosure the method is executed and controlled partly with a software program and partly with a hardware circuit.

In another aspect of the present disclosure the resistive change memory element is a nanotube block switch.

In another aspect of the present disclosure the resistive change memory element is a metal oxide switch.

Other features and advantages of the present invention will become apparent from the following description of the invention which is provided below in relation to the accompanying drawings.

BRIEF DESCRIPTION OF THE DRAWINGS

In the Drawings,

FIGS. 3A-3D are schematics illustrating exemplary programming circuits which can be used to set, reset, and read the state of a resistive change memory cell.

DETAILED DESCRIPTION

The present disclosure teaches a method of resetting a resistive change memory cell wherein the resistive change memory element is prevented from entering a "deep set" state, a state wherein the resistive change memory element is driven into a very low resistive state from which it cannot be returned into a high resistive state using an available range of programming pulses. Such a condition is avoided, according to the methods of the present disclosure, by using a first set of programming parameters to reset a resistive change memory cell when it is in a valid set state and using a second set of programming parameters when it is within the "grey zone," the range of resistance values between a valid set state and a valid reset state.

Resistive change memory cells store information through the use of a resistive change memory element within the cell. Responsive to electrical stimuli, this resistive change memory element can be adjusted between at least two non-volatile resistive states. Typically, two resistive states are used: a low resistive state (corresponding, typically, to a logic '1') and a high resistive state (corresponding, typically, to a logic '0'). In this way, the resistance value of the memory change element within the resistive change memory cell can be used to a store a bit (one binary digit) of information. In some applications, more than two resistive states are used, allowing a single cell to store more than one bit of information. For example, a resistive change memory cell might adjust its resistive change memory element between four non-volatile resistive states, allowing for the storage of two bits of information in a single cell.

Figure 1:
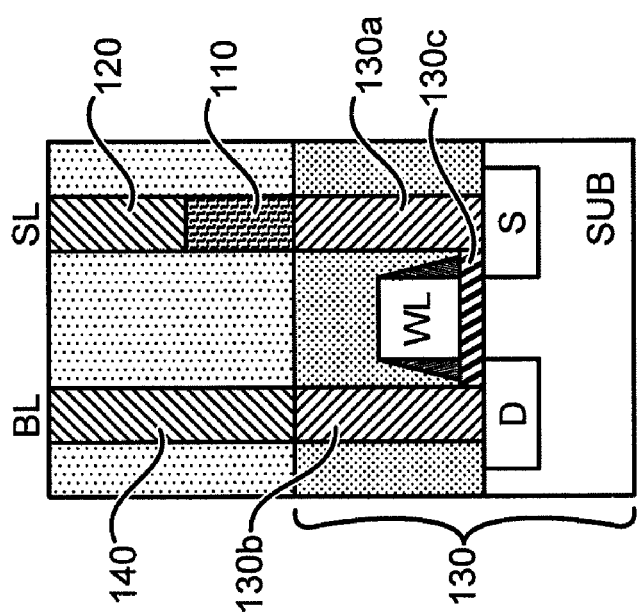
FIG. 1 is an illustration depicting the layout of a vertically oriented resistive change memory cell.

FIG. 1 illustrates the layout of an exemplary resistive change memory cell which includes a vertically oriented memory change element (such a structure is sometimes termed a 3D memory cell by those skilled in the art). A typical FET device 130 is formed within a first device layer, including a drain (labeled "D" within FIG. 1), a source (labeled "S" within FIG. 1), and a gate structure 130c. The structure and fabrication of such an FET device 130 will be well known to those skilled in the art.

A resistive change memory element 110 is formed in a second device layer. Conductive structure 130a electrically couples a first end of resistive change memory element 110 with the source terminal of FET device 130. Conductive structure 120 electrically couples a second end of resistive change memory element 110 with an external source line (labeled SL within FIG. 1) outside the memory cell. Conductive structures 130b and 140 electrically couple the drain terminal of FET device 130 with an external bit line (labeled BL within FIG. 1). An external word line (labeled WL within FIG. 1) is electrically coupled to gate structure 130c.

Figure 2:
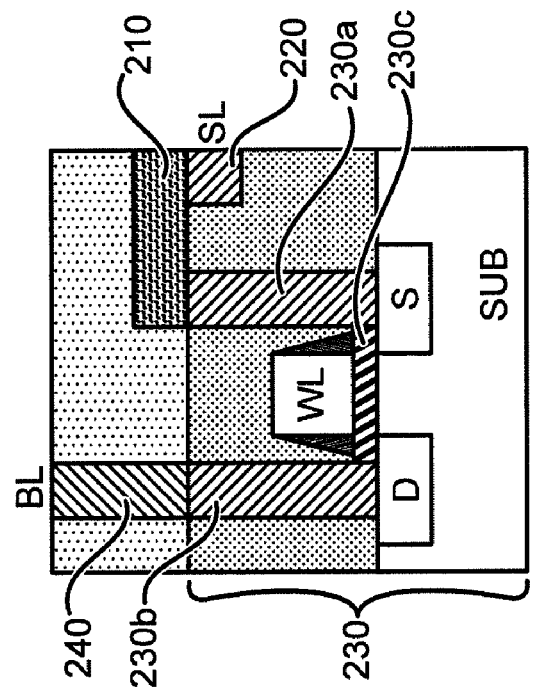
FIG. 2 is an illustration depicting the layout of a horizontally oriented resistive change memory cell.

FIG. 2 illustrates the layout of an exemplary resistive change memory cell which includes a horizontally oriented memory change element (such a structure is sometimes termed a 2D memory cell by those skilled in the art). A typical FET device 230 is formed within a first device layer, including a drain (labeled "D" within FIG. 2), a source (labeled "S" within FIG. 2), and a gate structure 230c. As with the FET device (130) depicted in FIG. 1, the structure and fabrication of such an FET device 230 will be well known to those skilled in the art.

A resistive change memory element 210 is formed in a second device layer. Conductive structure 230a electrically couples a first end of resistive change memory element 210 with the source terminal of FET device 230. Conductive structure 220 electrically couples a second end of resistive change memory element 210 with an external source line (labeled SL within FIG. 2) outside the memory cell. Conductive structures 230b and 240 electrically couple the drain terminal of FET device 230 with an external bit line (labeled BL within FIG. 2). An external word line (labeled WL within FIG. 2) is electrically coupled to gate structure 230c.

Within both of the memory cells depicted in FIGS. 1 and 2, the resistive change memory element is adjusted between different resistive states by applying electrical stimuli, typically one or more programming pulses of specific voltages and pulse widths, between the bit line (BL) and the source line (SL), and a voltage is applied to the gate structure (130c in FIG. 1 and 230c in FIG. 2) through the word line (WL). This allows electrical current to flow through the series combination of the FET device (130 in FIG. 1 and 230 in FIG. 2), which, depending on the gate voltage applied, may act as a current limiting device, and the resistive change memory element (110 in FIG. 1 and 210 in FIG. 2). By controlling the magnitude and the duration of this electrical current, the resistive change memory element (110 in FIG. 1 and 210 in FIG. 2) can be adjusted between a plurality of resistive states.

The state of the memory cells depicted in FIGS. 1 and 2 can be determined by applying a DC test voltage, for example, but not limited to, 0.5V, between the source line (SL) and the (BL) while applying a voltage to gate structure (130c in FIG. 1 and 230c in FIG. 2) sufficient to turn on the FET device (130 in FIG. 1 and 230 in FIG. 2) and measuring the current through the resistive change memory element (110 in FIG. 1 and 210 in FIG. 2). In some applications this current can be measured by using a power supply with a current feedback output, for example, a programmable power supply or a sense amplifier. In other applications this current can be measured by inserting a current measuring device in series with the resistive change memory element (110 in FIG. 1 and 210 in FIG. 2).

Alternatively, the state of the memory cells depicted in FIGS. 1 and 2 can also be determined by driving a fixed DC current, for example, but not limited to, 1 µA, through the series combination of the FET device (130 in FIG. 1 and 230 in FIG. 2) and the resistive memory change element (110 in FIG. 1 and 210 in FIG. 2) while applying a voltage to the gate (130c in FIG. 1 and 230c in FIG. 2) sufficient to turn on the FET device (130 in FIG. 1 and 230 in FIG. 2) and measuring the voltage across the resistive change memory element (110 in FIG. 1 and 210 in FIG. 2).

The resistive change element within a resistive change memory cell (such as, but not limited to, those depicted in FIGS. 1 and 2) can be formed from a plurality of materials, such as, but not limited to, metal oxide, solid electrolyte, phase change material such as a chalcogenide glass, and carbon nanotubes.

For example, U.S. patent application Ser. No. 11/280,786 to Bertin et al., incorporated herein by reference, teaches a two terminal nanotube switching device comprising a first and second conductive terminals and a nanotube article. Bertin teaches methods for adjusting the resistivity of the nanotube fabric article between a plurality of nonvolatile resistive states. In at least one embodiment, electrical stimuli is applied to at least one of the first and second conductive elements such as to pass an electric current through said nanotube fabric layer. By carefully controlling these electrical stimuli within a certain set of predetermined parameters (as described by Bertin in U.S. patent application Ser. No. 11/280,786) the resistivity of the nanotube article can be repeatedly switched between a relatively high resistive state and relatively low resistive state. In certain embodiments, these high and low resistive states can be used to store a digital bit of data (that is, a logic '1' or a logic '0').

While some examples of resistive change memory cells and elements within the present disclosure specifically reference carbon nanotube based resistive change memory cells and elements, the methods of the present disclosure are not limited in this regard. Indeed, it will be clear to those skilled in the art that the methods of the present invention are applicable to any type of resistive change memory cell or element.

FIGS. 3A-3D are simplified schematics of programming circuits which can be used to generate and applying electrical stimuli, for example, programming pulses of predetermined voltage levels and pulse widths, to a resistive change memory element within a resistive change memory cell.

Referring now to FIG. 3A, a first programming circuit is depicted. A programmable voltage source 330a is used to apply a programming voltage across a resistive change memory cell represented by FET device 320a (analogous to the FET devices of FIGS. 1 and 2) and resistive change memory element 310a (analogous to the resistive change memory elements of FIGS. 1 and 2). Programmable voltage source 330a is responsive to an external control 360a (supplied, for example, from a software controlled algorithm executed within a microprocessor or microcontroller, or from an FPGA or hardware control circuit) which sets and executes one or more programming pulses. Programmable voltage source 330a also provides a feedback output 370a indicating the current it is supplying during operation. This feedback output 370a can be used to read the state of resistive memory change element 310a between programming pulses.

Referring now to FIG. 3B, a second programming circuit is depicted. A pulse generator 330b is placed across a resistive change memory cell represented by fixed resistor 320b (which replaces the FET devices of FIGS. 1 and 2 as a current limiting device) and resistive change memory element 310a (analogous to the resistive change memory elements of FIGS. 1 and 2). An ammeter 340b is wired in series with resistive change memory element 310b. In this way, pulse generator 330b can be used to apply programming pulses while ammeter 340b monitors current through the resistive change memory element 310b. Within such a circuit, the pulse generator 330b is required to apply both programming pulses (in order to adjust the resistive state of resistive change memory element 310b) and test voltages (in order to read the resistive state of resistive change memory element 310b).

Referring now to FIG. 3C, a third programming circuit is depicted. A pulse generator 330c and a fixed voltage supply 335c are connected through a relay switching device 350c to resistive change memory element 310c (analogous to the resistive change memory elements of FIGS. 1 and 2). The relay switching device 350c, responsive to an external control 390c, selects between the pulse generator 330c (which provides programming pulses through fixed resistor 320c) and the fixed voltage supply 335c (which provides test voltages through fixed resistor 327c). As within the circuit of FIG. 3B, an ammeter 340c is wired in series with resistive change memory element 310c to monitor current through the resistive change memory element 310c during read cycles.

Referring now to FIG. 3D, a fourth programming circuit is depicted. A pulse generator 330d and a fixed voltage supply 335d are connected through a first relay switching device 350d to resistive change memory element 310d (analogous to the resistive change memory elements of FIGS. 1 and 2). The relay switching device 350c, responsive to an external control 390c, selects between the pulse generator 330c (which provides programming pulses through one of two fixed resistors 320d or 325d) and the fixed voltage supply 335d (which provides test voltages through fixed resistor 327d). A second relay switching device 355d provides a control to select between a first current limiting resistor 320d and a second limiting resistor 325d in series with pulse generator 330d. In this way, the value of the current limiting series resistor (analogous to the FET devices of FIGS. 1 and 2) used within a programming operation can be adjusted between programming pulses. As within the circuits of FIGS. 3B and 3C, an ammeter 340d is wired in series with resistive change memory element 310d to monitor current through the resistive change memory element 310d during read cycles.

Within the programming of resistive change memory cells, two types of programming operations are employed. A "set" operation is used to adjust a resistive change memory element from a high resistive state to a low resistive state. Typically, a series of programming pulses, systematically increasing in pulse width and voltage level, are applied to the resistive change memory element until the resistance of the memory change element is below a predefined set resistance threshold. A "reset" operation is used to adjust a resistive change memory element from a low resistive state to a high resistive state. As with the set operation, typically a series of programming pulses, systematically increasing in pulse width and voltage level, are applied to the resistive change memory element until the resistance is above a predefined reset resistance threshold. Typically, both operations will include first applying a programming pulse at a specified voltage level and then applying a test voltage to observe any change in resistance. This two step process is repeated until the desired threshold resistance value is crossed.

The voltage levels used for a reset operation are typically higher than those used for a set operation, and the programming pulses in a set operation are sometimes applied through a fixed series resistance to limit the current through the resistive change memory element. The pulse widths and voltage levels used in each operation are selected based on the needs of a specific application. For example, the physical dimensions of the resistive change memory element, the type of resistive change memory element used, and the specific set and reset threshold values used all factor into the specific voltage level and pulse width of programming pulses applied.

For example, within a typical carbon nanotube based memory cell, wherein a carbon nanotube fabric layer is used as a resistive change memory element, a set resistance threshold value might be on the order of 1 M$\Omega$ and a reset resistance threshold might be on the order of 10M$\Omega$. In such an application the programming pulses used in a set operation might range from 2V to 4V (applied through a 500 k$\Omega$ fixed series resistance) with pulse widths ranging from 5 µs to 5 ms. In the same application the programming pulses used in a reset operation might range from 4V to 6V with pulse widths ranging from 500 ns to 1000 ns. It should be noted that the preceding example is provided only to illustrate a set of typical set and reset parameters for an exemplary resistive change memory cell. As such, the methods of the present disclosure should not be limited to such parameters.

Hysteresis is typically built into the resistance thresholds within resistive change memory cells in order to allow for an unambiguous read operation. That is, the set resistance threshold value and the reset resistance threshold value are typically offset from each other by some range, providing a range of resistance values between these threshold values for which the resistive memory change element is in neither a set nor a reset state. This undefined range is typically referred to as the "grey-zone".

Figure 4:
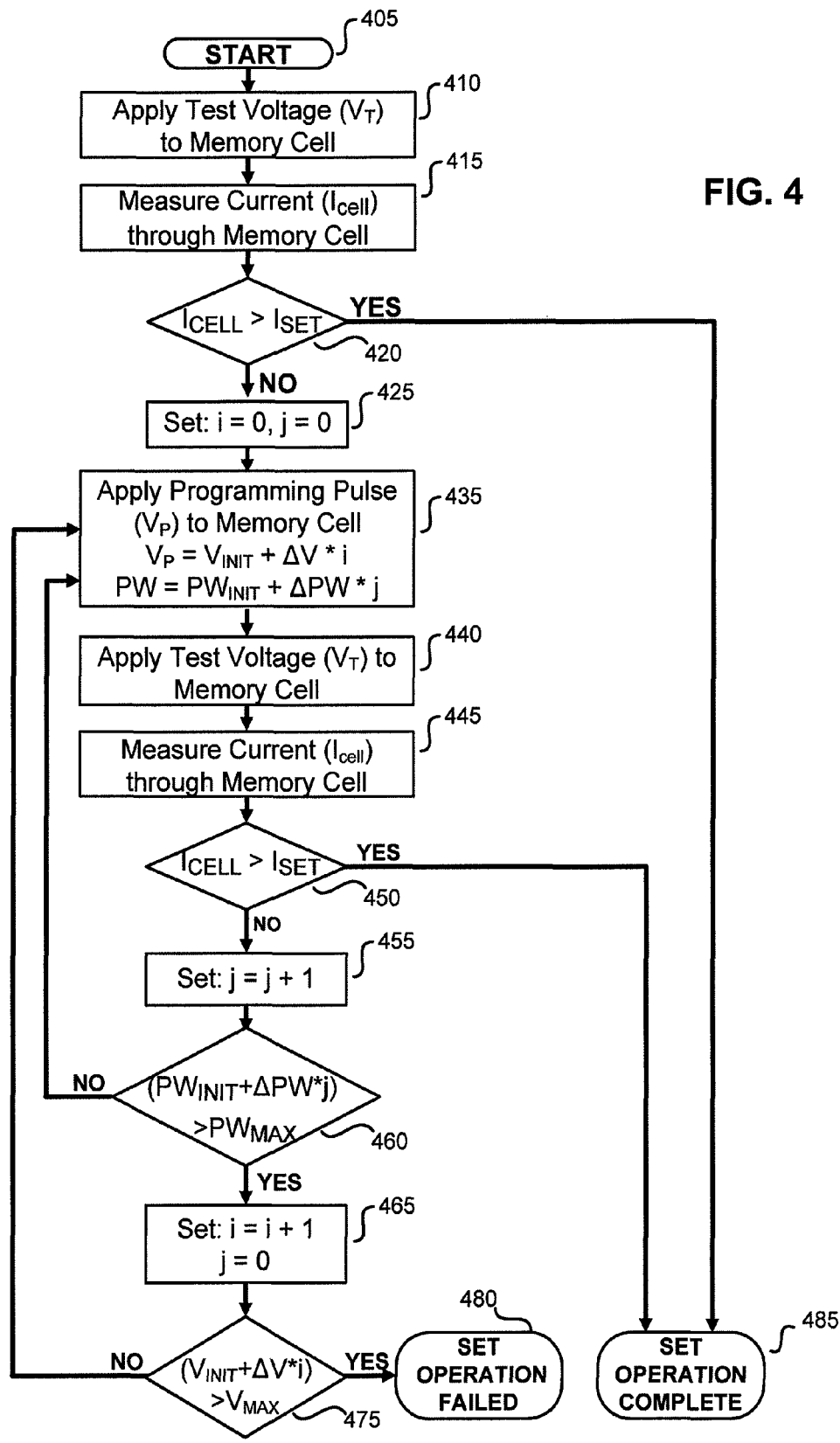
FIG. 4 is a flow chart describing an exemplary algorithm for setting a resistive change memory cell.

FIG. 4 is a flow chart depicting an algorithm for an exemplary set operation, that is the adjustment of a resistive change memory cell from a high resistive state to a low resistive state for a resistive change memory cell.

At the start of the process 405 the memory cell to be programmed is connected to a programming circuit (such as, but not limited to, those depicted in FIGS. 3A-3D and described above). In a next process step 410, a test voltage ($V_T$) is applied to the memory cell. In a second process step 415, the current through the memory cell ($I_{CELL}$) is observed in order to determine the initial resistive state of the memory cell. In a next process step 420, $I_{CELL}$ is compared against the predetermined set current threshold ($I_{SET}$)—that is, the current value corresponding to the set resistance threshold for the applied test voltage ($V_T$). If $I_{CELL}$ is greater than $I_{SET}$, then the algorithm determines that the memory cell is already in a valid set state and concludes to the SET OPERATION COMPLETE process step 485. Otherwise, that is, if $I_{CELL}$ is less than or equal to $I_{SET}$, the algorithm advances to the next process step 425 wherein counting variables "i" and "j" are both initialized to zero, and the programming cycle is begun.

In a next processing step 435, a programming pulse ($V_P$) is applied to the memory cell. This programming pulse ($V_P$) is set to a voltage level of:

$$V_{INIT}+(\Delta V*i)$$

where:
$V_{INIT}$=a predetermined initial starting voltage for the set operation
$\Delta V$=a predetermined voltage level scaling factor for the set operation
i=a counting variable incremented in process step 465
and with a pulse width (PW) of:

$$PW_{INIT}+(\Delta PW*j)$$

where:
$PW_{INIT}$=a predetermined initial starting pulse width for the set operation
$\Delta PW$=a predetermined pulse width scaling factor for the set operation
j=a counting variable incremented in process step 455

After the programming pulse has been applied to the memory cell, a test voltage ($V_T$) is applied to the memory cell in process step 440. In a next process step 445, the current through the memory cell ($I_{CELL}$) is observed in order to determine the new resistive state of the memory cell. In a next process step 450, $I_{CELL}$ is compared against the predetermined set current threshold ($I_{SET}$), that is, the current value corresponding to the set resistance threshold for the applied test voltage ($V_T$). If $I_{CELL}$ is greater than $I_{SET}$, then the algorithm determines that the memory cell is now in a valid set state and concludes to the SET OPERATION COMPLETE process step 485. Otherwise, that is, if $I_{CELL}$ is less than or equal to $I_{SET}$, the algorithm advances to the next process step 455 wherein the counting variable j is incremented (effectively increasing the pulse width of the programming pulse for the next cycle), and the programming cycle is continued.

In a next process step 460, the pulse width set for the next programming pulse, $PW_{INIT}+(\Delta PW*j)$, is compared against a predetermined maximum pulse width value for the set operation ($PW_{MAX}$). If this maximum value has not been exceeded, then the algorithm returns to process step 435 and a new programming pulse is applied. However, if this maximum value has been exceeded, that is, if the next pulse width to be applied is greater than the value of $PW_{MAX}$, then the algorithm advances to process step 465.

Within process step 465, the counting variable "i" is incremented (effectively increasing the voltage level of the programming pulse for the next cycle) and the counting variable j is reset back to zero (effectively returning the pulse width of the programming pulse back to $PW_{INIT}$ for the next cycle). In a next process step 475, the voltage level set for the next programming pulse, $V_{INIT}+(\Delta V*i)$, is compared against a predetermined maximum voltage level for the set operation ($V_{MAX}$). If this maximum value has been exceeded, that is, if the voltage level of the next programming pulse to be applied is greater than the value of $V_{MAX}$, then the algorithm concludes to the SET OPERATION FAILED process step 480. However, if this maximum value ($V_{MAX}$) has not been exceeded, then the algorithm returns to process step 435 and a new programming pulse is applied.

In this way, a series of programming pulses will be applied at varying pulse widths and voltage levels until either the memory cell is adjusted into a valid set state (resulting in a successful conclusion to the set operation in process step 485) or all possible variations of programming pulses as determined by the supplied constants—$V_{INIT}$, $\Delta V$, $V_{MAX}$, $PW_{INIT}$, $\Delta PW$, and $PW_{MAX}$—have been tried without success (resulting in an unsuccessful conclusion to the set operation in process step 480).

It should be noted that while the algorithm depicted in FIG. 4 and described in detail above describes a specific process in order to illustrate an exemplary set operation, the methods of the present invention should not be limited to this specific example. Indeed, it will be clear to those skilled in the art that the set operation detailed in FIG. 4 could be adjusted in a plurality of ways to optimize a set operation for a specific application.

For example, within some applications it may be desirable to cycle through a plurality of voltage levels on a programming pulse before increasing pulse width (as opposed to cycling through a plurality of pulse widths before increasing the voltage level, as described in FIG. 4). In other applications, it may be desirable to only vary one parameter (either voltage level or pulse width). In still other applications, it may be desirable to vary other parameters (such as, but not limited to, series resistance and programming pulse rise and fall time) along with or in place of voltage level and pulse width. In still other applications, it may be desirable to apply a range of programming currents of varying magnitude and duration instead of voltage pulses.

It is preferred, then, that the preceding description of an exemplary set process be representative and inclusive of these variations and not otherwise limited to the specific illustrative parameters detailed.

Figure 5:
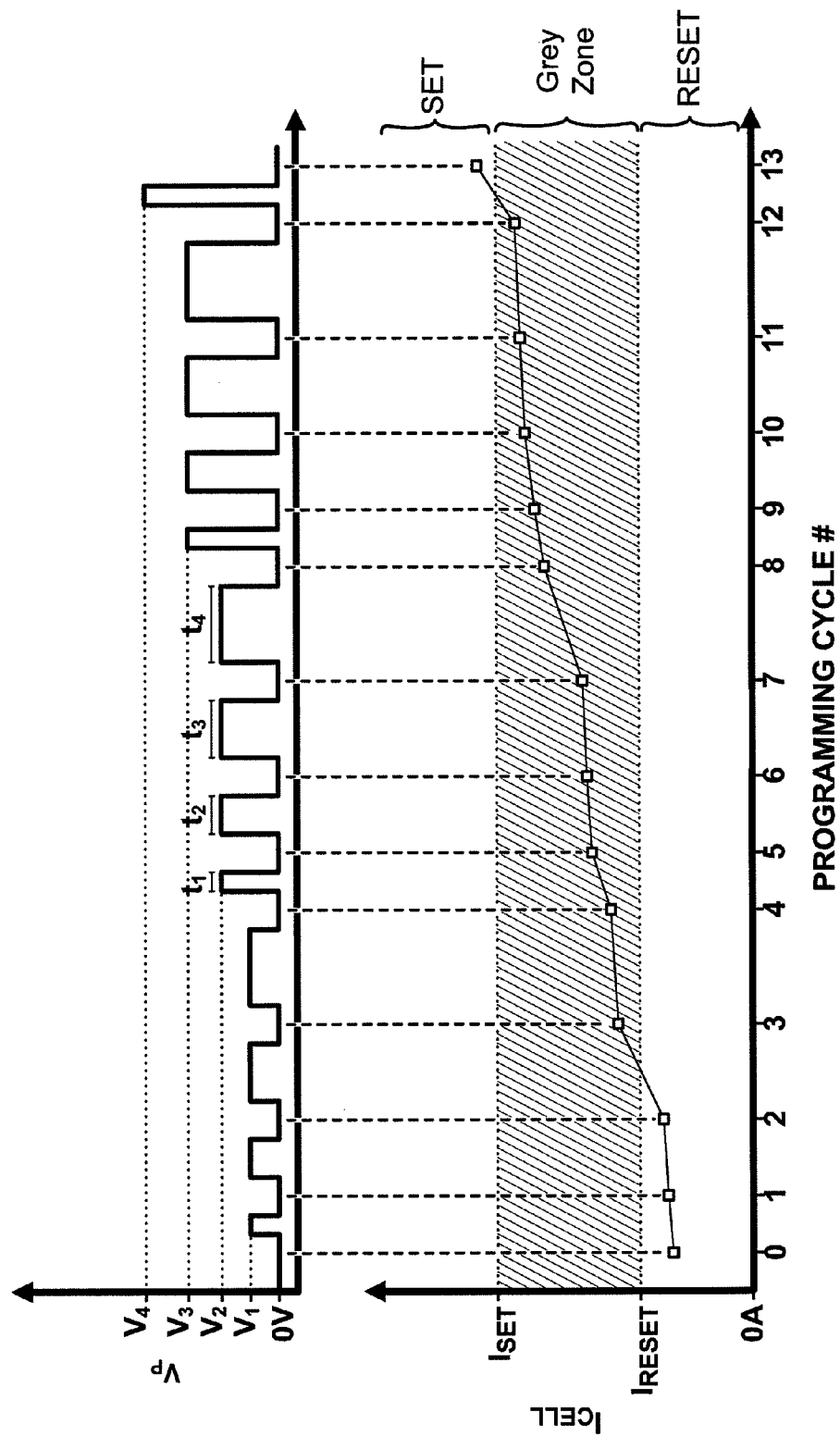
FIG. 5 is a waveform diagram depicting a set operation performed on a resistive change memory cell according to the algorithm described in FIG. 4.

FIG. 5 is a waveform diagram illustrating the set operation of a resistive change memory cell according to the algorithm detailed in FIG. 4. The upper waveform diagram in FIG. 5 is a time domain plot of the series of programming pulses ($V_P$) applied to the memory cell as determined by the set operation algorithm of FIG. 4. The lower waveform diagram in FIG. 5 is a plot of the test currents ($I_{CELL}$) read after each programming pulse is applied. The lower waveform is divided into three horizontal regions. The region between 0A and $I_{RESET}$, wherein a test current ($I_{CELL}$) reading indicates that the memory cell is in a valid reset state. The region above $I_{SET}$, wherein a test current ($I_{CELL}$) reading indicates that the memory cell is in a valid set state. And the region above $I_{RESET}$ and below $I_{SET}$, wherein a test current ($I_{CELL}$) reading indicates that the memory cell is in the "grey zone"—that is, the cell is in neither a valid set nor a valid reset state.

Programming cycle "0" on the horizontal axis of the plot in FIG. 5 corresponds to process step 415 in FIG. 4 (the determination of the initial resistive state of the memory cell before any programming pulses are applied). Programming cycles 1 through 13 on the horizontal axis of the plot in FIG. 5 correspond to process step 445 in FIG. 5 (the determination of the new resistive state of the memory cell after each programming pulse is applied).

The voltage levels on the vertical axis of the upper waveform plot ($V_1$-$V_4$) in FIG. 5 correspond to the voltage levels ($V_P$) applied in process step 435 in FIG. 4. That is:

$$V_1 = V_{INIT}$$

$$V_2 = V_{INIT} + \Delta V$$

$$V_3 = V_{INIT} + (\Delta V*2)$$

$$V_4 = V_{INIT} + (\Delta V*3)$$

The pulse widths indicated on the upper waveform plot ($t_1$-$t_4$) in FIG. 5 correspond to the pulse widths (PW) applied in process step 435 in FIG. 4. That is:

$$t_1 = PW_{INIT}$$

$$t_2 = PW_{INIT} + \Delta PW$$

$$t_3 = PW_{INIT} + (\Delta PW*2)$$

$$t_4 = PW_{INIT} + (\Delta PW*3)$$

The current value, $I_{SET}$, on the vertical axis of the lower waveform in FIG. 5 corresponds to the threshold current $I_{SET}$ used in process steps 420 and 450 in FIG. 4. The current value $I_{RESET}$ and the marked "grey zone" region on the vertical axis of the lower waveform in FIG. 5 are not used in the set algorithm described in FIG. 4, but have been included in FIG. 4 as they are relevant to the discussions of FIGS. 7A, 7B, and 9.

Referring now to FIG. 5, at programming cycle 0 a test voltage is applied—prior to the application of any programming pulses—and it is determined that the memory cell is initially in a valid reset state. At programming cycle 1, a test voltage is applied after a first programming pulse is applied and shows that $I_{CELL}$ has increased—which indicates that the resistance of the memory cell has decreased. Programming cycles 2-13 show $I_{CELL}$ continuing to increase—and, thus, the resistance of the memory cell continuing to decrease—after each programming pulse, moving closer and closer to the $I_{SET}$ threshold line. At programming cycle 13—after thirteen programming pulses have been applied at increasing pulse widths and voltages according to the algorithm of FIG. 4—$I_{CELL}$ reads above $I_{SET}$, and the algorithm concludes successfully with the memory cell now in a valid set state.

Figure 6:
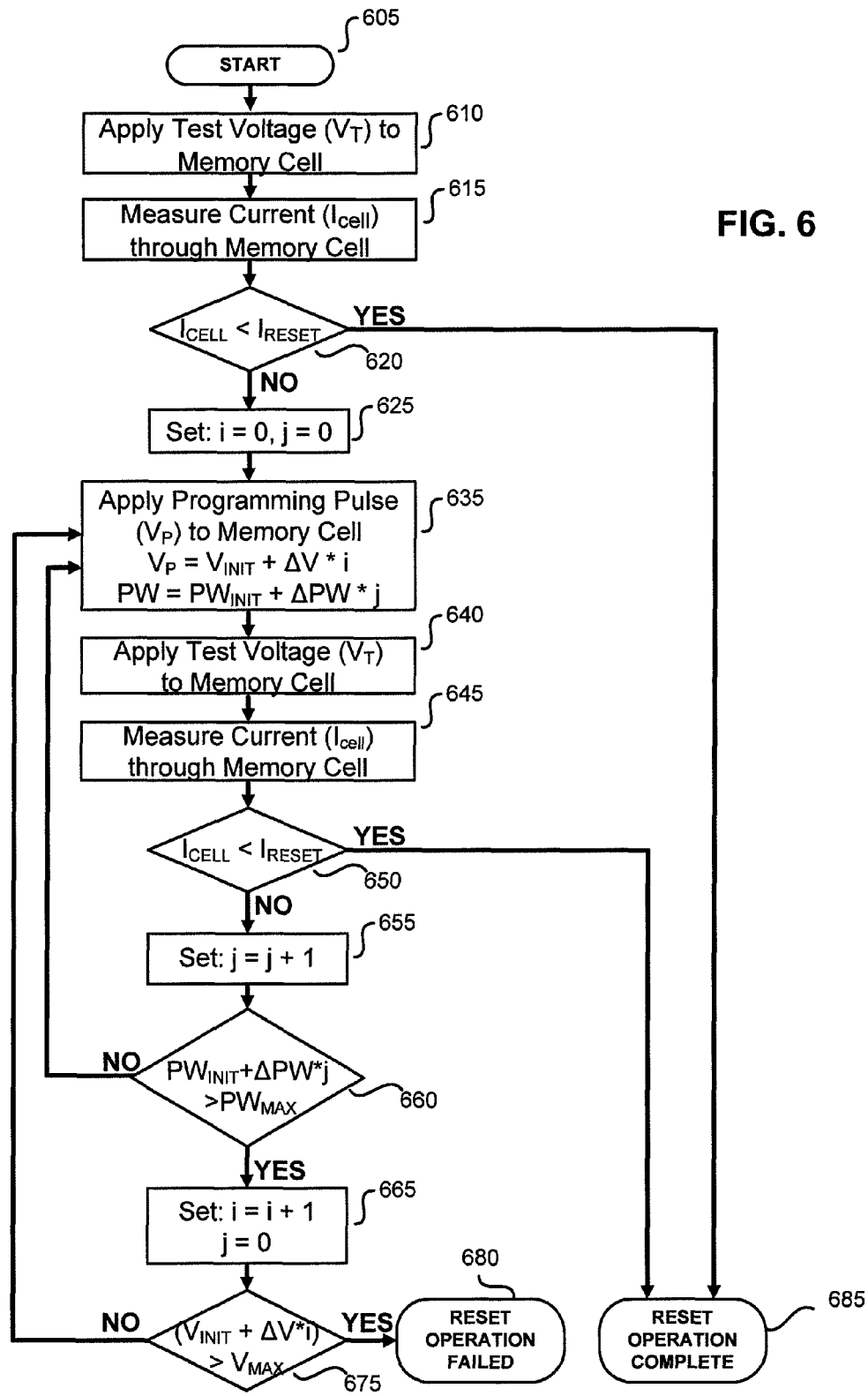
FIG. 6 is a flow chart describing an exemplary algorithm for resetting a resistive change memory cell.

FIG. 6 is a flow chart depicting an algorithm for an exemplary reset operation—that is the adjustment of a resistive change memory cell from a low resistive state to a high resistive state—for a resistive change memory cell.

At the start of the process 605 the memory cell to be programmed is connected to a programming circuit (such as, but not limited to, those depicted in FIGS. 3A-3D and described above). In a next process step 610, a test voltage ($V_T$) is applied to the memory cell. In a second process step 615, the current through the memory cell ($I_{CELL}$) is observed in order to determine the initial resistive state of the memory cell. In a next process step 620, $I_{CELL}$ is compared against the predetermined reset current threshold ($I_{RESET}$)—that is, the current value corresponding to the reset resistance threshold for the applied test voltage ($V_T$). If $I_{CELL}$ is less than $I_{RESET}$, then the algorithm determines that the memory cell is already in a valid reset state and concludes to the RESET OPERATION COMPLETE process step 685. Otherwise—that is, if $I_{CELL}$ is greater than or equal to $I_{RESET}$—the algorithm advances to the next process step 625 wherein counting variables "i" and "j" are both initialized to zero, and the programming cycle is begun.

In a next processing step 635, a programming pulse ($V_P$) is applied to the memory cell. This programming pulse ($V_P$) is set to a voltage level of:

$$V_{INIT}+(\Delta V*i)$$

where:
$V_{INIT}$=a predetermined initial starting voltage for the reset operation
$\Delta V$=a predetermined voltage level scaling factor for the reset operation
i=a counting variable incremented in process step 665
and with a pulse width (PW) of:

$$PW_{INIT}+(\Delta PW*j)$$

where:
$PW_{INIT}$=a predetermined initial starting pulse width for the reset operation
$\Delta PW$=a predetermined pulse width scaling factor for the reset operation
j=a counting variable incremented in process step 655

After the programming pulse has been applied to the memory cell, a test voltage ($V_T$) is applied to the memory cell in process step 640. In a next process step 645, the current through the memory cell ($I_{CELL}$) is observed in order to determine the new resistive state of the memory cell. In a next process step 650, $I_{CELL}$ is compared against the predetermined reset current threshold ($I_{RESET}$)—that is, the current value corresponding to the reset resistance threshold for the applied test voltage ($V_T$). If $I_{CELL}$ is less than $I_{RESET}$, then the algorithm determines that the memory cell is now in a valid reset state and concludes to the RESET OPERATION COMPLETE process step 685. Otherwise—that is, if $I_{CELL}$ is greater than or equal to $I_{RESET}$—the algorithm advances to the next process step 655 wherein the counting variable j is incremented (effectively increasing the pulse width of the programming pulse for the next cycle), and the programming cycle is continued.

In a next process step 660, the pulse width set for the next programming pulse—$PW_{INIT}+(\Delta PW*j)$—is compared against a predetermined maximum pulse width value for the reset operation ($PW_{MAX}$). If this maximum value has not been exceeded, then the algorithm returns to process step 635 and a new programming pulse is applied. However, if this maximum value has been exceeded—that is, if the next pulse width to be applied is greater than the value of $PW_{MAX}$—then the algorithm advances to process step 665.

Within process step 665, the counting variable "i" is incremented (effectively increasing the voltage level of the programming pulse for the next cycle) and the counting variable j is reset back to zero (effectively returning the pulse width of the programming pulse back to $PW_{INIT}$ for the next cycle). In a next process step 675, the voltage level set for the next programming pulse—$V_{INIT}+(\Delta V*i)$—is compared against a predetermined maximum voltage level for the reset operation ($V_{MAX}$). If this maximum value has been exceeded—that is, if the voltage level of the next programming pulse to be applied is greater than the value of $V_{MAX}$—then the algorithm concludes to the RESET OPERATION FAILED process step 680. However, if this maximum value ($V_{MAX}$) has not been exceeded, then the algorithm returns to process step 635 and a new programming pulse is applied.

In this way, a series of programming pulses will be applied at varying pulse widths and voltage levels until either the memory cell is adjusted into a valid reset state (resulting in a successful conclusion to the reset operation in process step 685) or all possible variations of programming pulses as determined by the supplied constants—$V_{INIT}$, $\Delta V$, $V_{MAX}$, $PW_{INIT}$, $\Delta PW$, and $PW_{MAX}$—have been tried without success (resulting in an unsuccessful conclusion to the reset operation in process step 680).

It should be noted that while the algorithm depicted in FIG. 6 and described in detail above describes a specific process in order to illustrate an exemplary reset operation, the methods of the present invention should not be limited to this specific example. Indeed, it will be clear to those skilled in the art that the reset operation detailed in FIG. 6 could be adjusted in a plurality of ways to optimize a reset operation for a specific application.

For example, within some applications it may be desirable to cycle through a plurality of voltage levels on a programming pulse before increasing pulse width (as opposed to cycling through a plurality of pulse widths before increasing the voltage level, as described in FIG. 6). In other applications, it may be desirable to only vary one parameter (either voltage level or pulse width). In still other applications, it may be desirable to vary other parameters (such as, but not limited to, series resistance and programming pulse rise and fall time) along with or in place of voltage level and pulse width. In still other applications, it may be desirable to apply a range of programming currents of varying magnitude and duration instead of voltage pulses.

It is preferred, then, that the preceding description of an exemplary reset process be representative and inclusive of these variations and not otherwise limited to the specific illustrative parameters detailed.

Figure 7A:
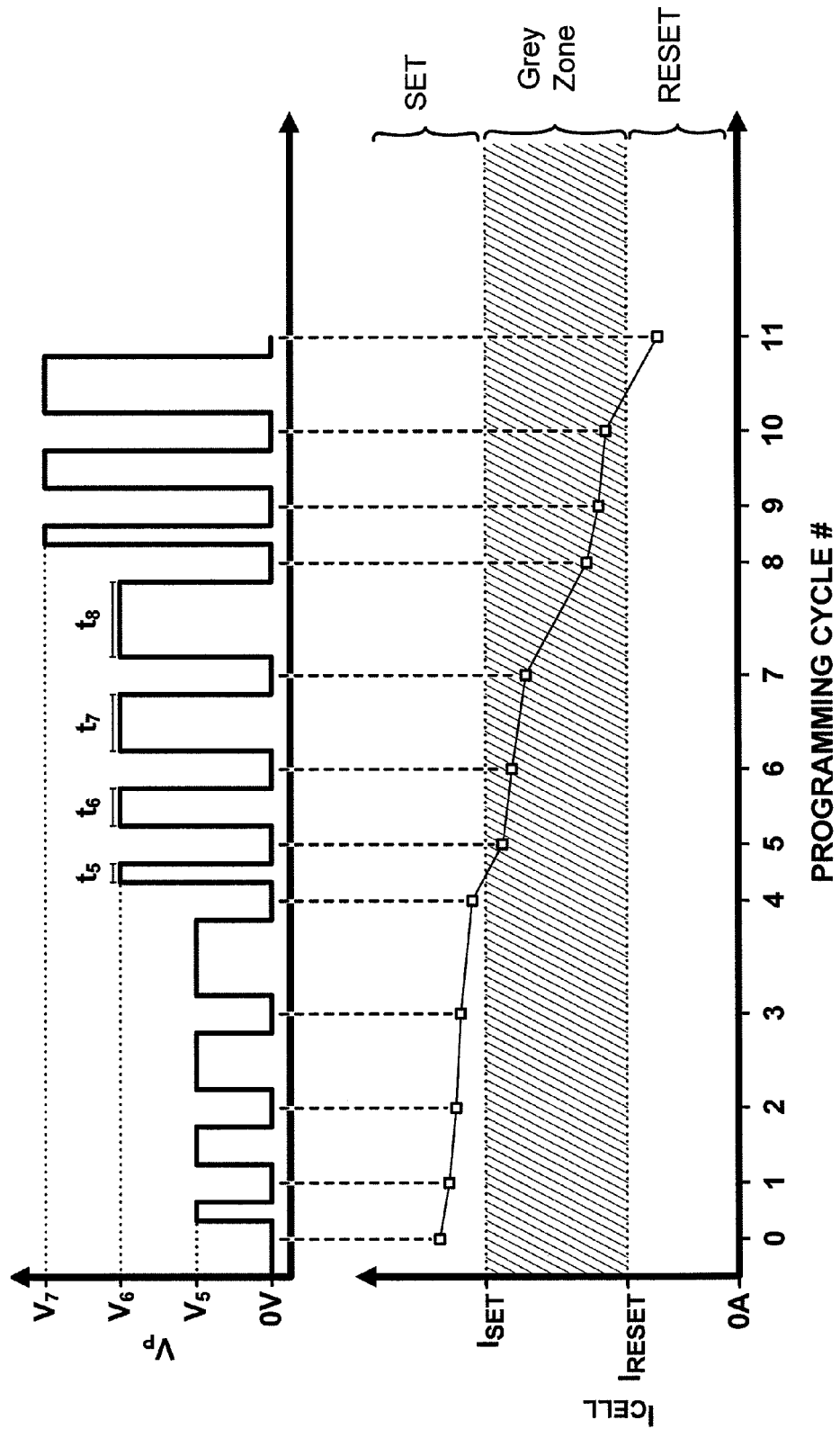
FIG. 7A is a waveform diagram depicting a reset operation performed on a resistive change memory cell according to the algorithm described in FIG. 6, which results in adjusting a resistive change memory element into a valid reset state.

FIG. 7A is a waveform diagram illustrating a successful reset operation of a resistive change memory cell (that is, a reset operation which adjusts the memory cell into a valid reset state) according to the algorithm detailed in FIG. 6. The upper waveform diagram in FIG. 7A is a time domain plot of the series of programming pulses ($V_P$) applied to the memory cell as determined by the reset operation algorithm of FIG. 6. The lower waveform diagram in FIG. 7A is a plot of the test currents ($I_{CELL}$) read after each programming pulse is applied. The lower waveform is divided into three horizontal regions. The region between 0A and $I_{RESET}$, wherein a test current ($I_{CELL}$) reading indicates that the memory cell is in a valid reset state. The region above $I_{SET}$, wherein a test current ($I_{CELL}$) reading indicates that the memory cell is in a valid set state. And the region above $I_{RESET}$ and below $I_{SET}$, wherein a test current ($I_{CELL}$) reading indicates that the memory cell is in the "grey zone"—that is, the cell is in neither a valid set nor a valid reset state.

Programming cycle "0" on the horizontal axis of the plot in FIG. 7A corresponds to process step 615 in FIG. 6 (the determination of the initial resistive state of the memory cell before any programming pulses are applied). Programming cycles 1 through 11 on the horizontal axis of the plot in FIG. 7A correspond to process step 645 in FIG. 6 (the determination of the new resistive state of the memory cell after each programming pulse is applied).

The voltage levels on the vertical axis of the upper waveform plot ($V_5$-$V_7$) in FIG. 7A correspond to the voltage levels ($V_P$) applied in process step 635 in FIG. 6. That is:

$$V_5 = V_{INIT}$$

$$V_6 = V_{INIT} + \Delta V$$

$$V_7 = V_{INIT} + (\Delta V * 2)$$

The pulse widths indicated on of the upper waveform plot ($t_5$-$t_8$) in FIG. 7A correspond to the pulse widths (PW) applied in process step 635 in FIG. 6. That is:

$$t_5 = PW_{INIT}$$

$$t_6 = PW_{INIT} + \Delta PW$$

$$t_7 = PW_{INIT} + (\Delta PW * 2)$$

$$t_8 = PW_{INIT} + (\Delta PW * 3)$$

The current value, $I_{RESET}$, on the vertical axis of the lower waveform in FIG. 7A corresponds to the threshold current $I_{RESET}$ used in process steps 620 and 650 in FIG. 6. The current value $I_{SET}$ and the marked "grey zone" region on the vertical axis of the lower waveform in FIG. 7A are not used in the reset algorithm described in FIG. 6, but have been included in FIG. 7A as they are relevant to the discussions of FIGS. 5 and 9.

Referring now to FIG. 7A, at programming cycle 0 a test voltage is applied—prior to the application of any programming pulses—and it is determined that the memory cell is initially in a valid set state. At programming cycle 1, a test voltage is applied after a first programming pulse is applied and shows that $I_{CELL}$ has decreased—which indicates that the resistance of the memory cell has increased. Programming cycles 2-11 show $I_{CELL}$ continuing to decrease—and, thus, the resistance of the memory cell continuing to increase—after each programming pulse, moving closer and closer the $I_{RESET}$ threshold line. At programming cycle 11—after eleven programming pulses have been applied at increasing pulse widths and voltages according to the algorithm of FIG. 6—$I_{CELL}$ reads below $I_{RESET}$, and the algorithm concludes successfully with the memory cell now in a valid reset state.

While the reset operation depicted in FIG. 7A depicts a successful reset operation following the algorithm detailed in FIG. 6—that is, the end result is that the resistive change memory cell is left in a high resistive (reset) state—such an operation may not always be so effective. As the programming pulses used to adjust the memory cell into higher and higher resistive states increase in voltage level and pulse width, there is a potential for those programming pulses to drive the memory cell back into a very low resistive state—usually referred to as a "deep set" state by those skilled in the art. This is especially true as the resistive change memory element enters the grey zone where the programming pulses are applied over higher resistances.

Figure 7B:
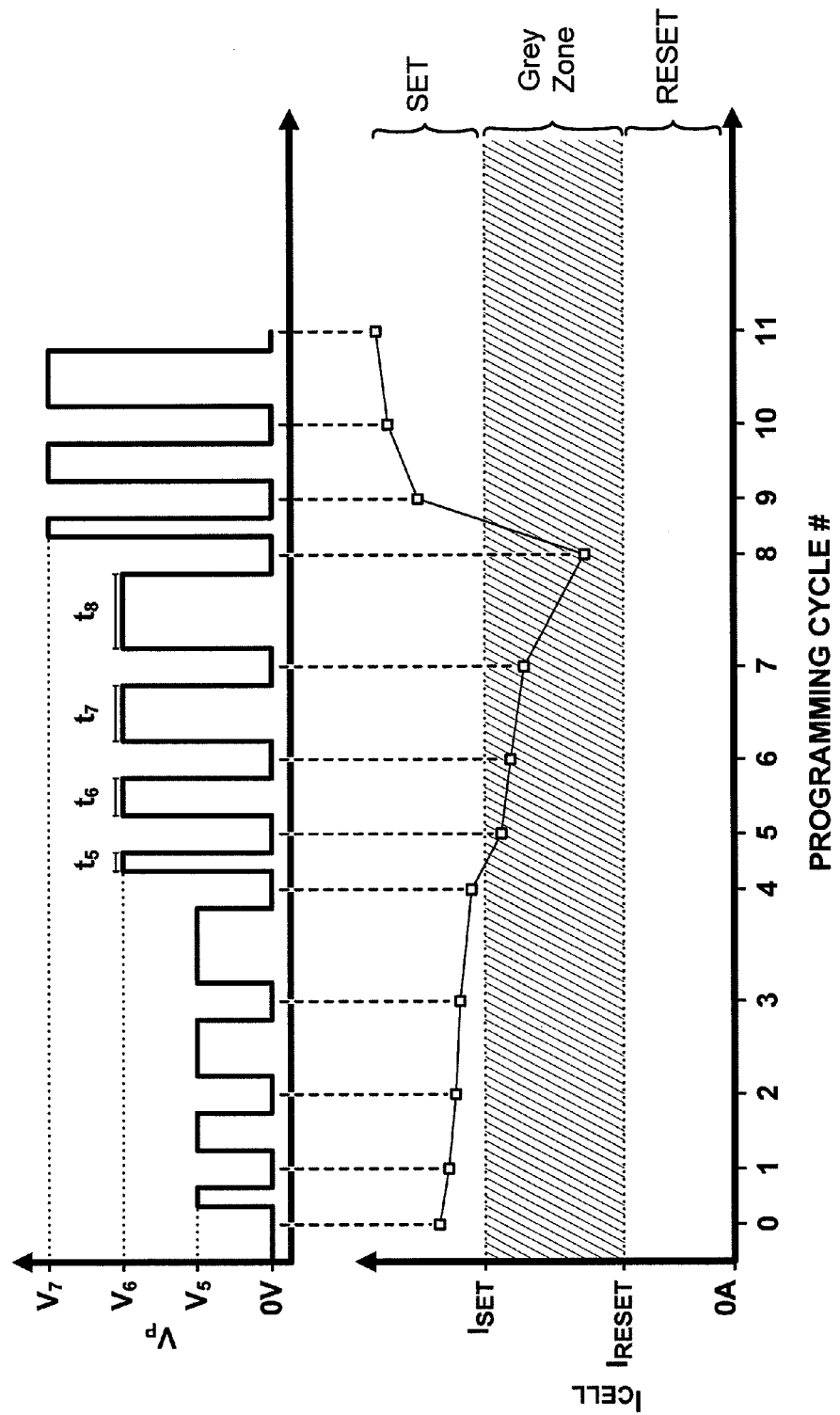
FIG. 7B is a waveform diagram depicting a reset operation performed on a resistive change memory cell according to the algorithm described in FIG. 6 which results in a adjusting a resistive change memory element into a "deep set" (very low resistive) state.

FIG. 7B is a waveform diagram illustrating a reset operation—again, according to the algorithm detailed in FIG. 6—of a resistive change memory cell which results in the memory cell in a deep set state.

As with FIG. 7A, the upper waveform diagram in FIG. 7B is a time domain plot of the series of programming pulses ($V_P$) applied to the memory cell as determined by the reset operation algorithm of FIG. 6. The lower waveform diagram in FIG. 7B is a plot of the test currents ($I_{CELL}$) read after each programming pulse is applied. The lower waveform is divided into three horizontal regions. The region between 0A and $I_{RESET}$, wherein a test current ($I_{CELL}$) reading indicates that the memory cell is in a valid reset state. The region above $I_{SET}$, wherein a test current ($I_{CELL}$) reading indicates that the memory cell is in a valid set state. And the region above $I_{RESET}$ and below $I_{SET}$, wherein a test current ($I_{CELL}$) reading indicates that the memory cell is in the "grey zone"—that is, the cell is in neither a valid set nor a valid reset state.

Programming cycle "0" on the horizontal axis of the plot in FIG. 7B corresponds to process step 615 in FIG. 6 (the determination of the initial resistive state of the memory cell before any programming pulses are applied). Programming cycles 1 through 11 on the horizontal axis of the plot in FIG. 7B correspond to process step 645 in FIG. 6 (the determination of the new resistive state of the memory cell after each programming pulse is applied).

The voltage levels on the vertical axis of the upper waveform plot ($V_5$-$V_7$) in FIG. 7B correspond to the voltage levels ($V_P$) applied in process step 635 in FIG. 6. That is:

$$V_5 = V_{INIT}$$

$$V_6 = V_{INIT} + \Delta V$$

$$V_7 = V_{INIT} + (\Delta V * 2)$$

The pulse widths indicated on of the upper waveform plot ($t_5$-$t_8$) in FIG. 7B correspond to the pulse widths (PW) applied in process step 635 in FIG. 6. That is:

$$t_5 = PW_{INIT}$$

$$t_6 = PW_{INIT} + \Delta PW$$

$$t_7 = PW_{INIT} + (\Delta PW * 2)$$

$$t_8 = PW_{INIT} + (\Delta PW * 3)$$

The current value, $I_{RESET}$, on the vertical axis of the lower waveform in FIG. 7B corresponds to the threshold current $I_{RESET}$ used in process steps 620 and 650 in FIG. 6. The current value $I_{SET}$ and the marked "grey zone" region on the vertical axis of the lower waveform in FIG. 7B are not used in the reset algorithm described in FIG. 6, but have been included in FIG. 7B as they are relevant to the discussions of FIGS. 5 and 9.

Referring now to FIG. 7B, at programming cycle 0 a test voltage is applied—prior to the application of any programming pulses—and it is determined that the memory cell is initially in a valid set state. At programming cycle 1, a test voltage is applied after a first programming pulse is applied and shows that $I_{CELL}$ has decreased—which indicates that the resistance of the memory cell has increased. Programming cycles 2-8 show $I_{CELL}$ continuing to decrease—and, thus, the resistance of the memory cell continuing to increase—after each programming pulse, moving closer and closer the $I_{RESET}$ threshold line.

At programming cycle 9, however, it can be seen that the ninth programming pulse (at a voltage level of $V_6$ and pulse width of $t_8$) has driven the memory cell into a very low resistive state—a deep set state. Unaware of this condition, the reset algorithm (detailed in FIG. 6) continues to apply programming pulses (increasing in voltage level and pulse width) until it has exhausted its range of programming pulses and exits with an error condition after programming cycle 11.

In certain applications, a deep set condition within a resistive change memory cell—as shown in FIG. 7B—may represent an unrecoverable state, essentially resulting in a "dead" or "stuck" bit. Large scale, very dense resistive change memory cell arrays (such as would be common on a memory chip, a solid state hard drive, or an embedded memory within a larger integrated circuit such as a microprocessor or an FPGA) will typically only have a limited range of voltage levels and supply current capacity available to drive programming pulses. Such limitations are necessitated for a plurality of reasons well known to those skilled in the art, such as, but not limited to, power limitations, surface area available, and requirements for heat dissipation. Within such applications entering a deep set condition could result in a dead bit within a memory array—that is, a bit within the array that is stuck at either 0 or 1 and cannot be reprogrammed—simply because the programming pulse required to return the memory cell back to a high resistive (reset) state cannot be generated. For example, for some resistive change materials—such as, but not limited, carbon nanotube fabric layers—as the resistance of the material becomes very low, the programming currents required to return that material to a higher resistive state become very large—in many cases too large to be supplied by onboard programming circuits. For such applications, there is a need for an improved reset algorithm which guards against entering a deep set condition.

Figure 8:
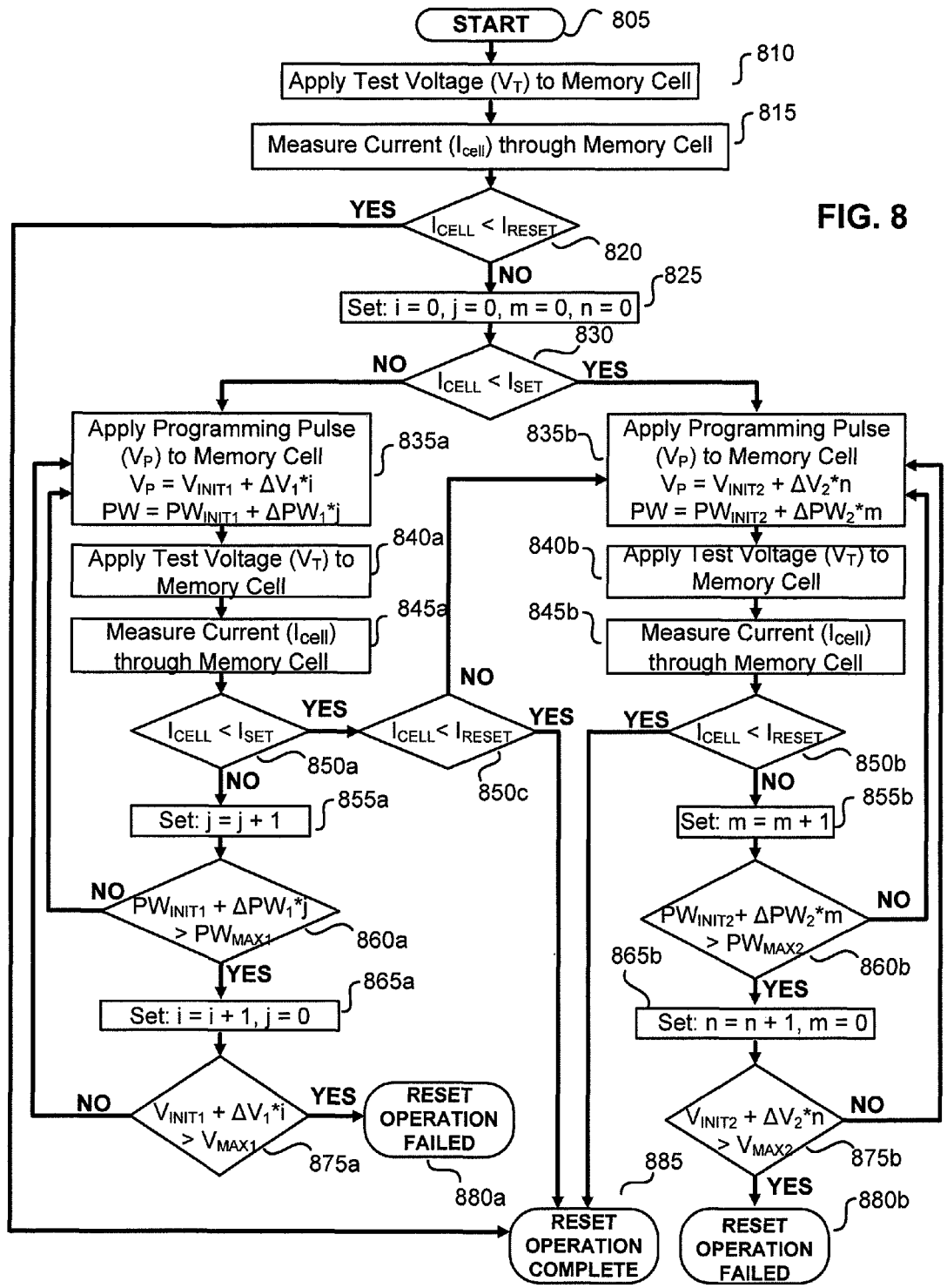
FIG. 8 is a flow chart describing an algorithm for resetting a resistive change memory cell according to the methods of the present disclosure.

FIG. 8 illustrates an improved reset algorithm which guards against entering a deep set condition.

At the start of the process 805 the memory cell to be programmed is connected to a programming circuit (such as, but not limited to, those depicted in FIGS. 3A-3D and described above). In a next process step 810, a test voltage ($V_T$) is applied to the memory cell. In a second process step 815, the current through the memory cell ($I_{CELL}$) is observed in order to determine the initial resistive state of the memory cell. In a next process step 820, $I_{CELL}$ is compared against the predetermined reset current threshold ($I_{RESET}$)—that is, the current value corresponding to the reset resistance threshold for the applied test voltage ($V_T$). If $I_{CELL}$ is less than $I_{RESET}$, then the algorithm determines that the memory cell is already in a valid reset state and concludes to the RESET OPERATION COMPLETE process step 885. Otherwise—that is, if $I_{CELL}$ is greater than or equal to $I_{RESET}$—the algorithm advances to the next process step 825 wherein counting variables i, j, m, and n are all initialized to zero, and the programming cycle is begun.

In a next process step 830, $I_{CELL}$ is compared against the predetermined set current threshold ($I_{SET}$)—that is, the current value corresponding to the set resistance threshold for the applied test voltage ($V_T$). If $I_{CELL}$ is greater than or equal to $I_{SET}$, then the algorithm determines that the memory cell is in a valid set state and advances to process step 835a, where a first set of programming parameters—$V_{INIT1}$, $\Delta V_1$, $V_{MAX1}$, $PW_{INIT1}$, $\Delta PW_1$, and $PW_{MAX1}$—are used to generate a series of programming pulses suitable for resetting a resistive change memory element that is in a valid set state. Otherwise—that is, if $I_{CELL}$ is less than $I_{SET}$—the algorithm determines that the memory cell is within the grey zone and advances to process step 835b, where a second set of programming parameters—$V_{INIT2}$, $\Delta V_2$, $V_{MAX2}$, $PW_{INIT2}$, $\Delta PW_2$, and $PW_{MAX2}$—are used to generate a series of programming pulses suitable for resetting a resistive change memory element that is within the grey zone.

Typically, the first set of programming parameters will be selected such that higher voltage programming pulses will be applied when the memory cell is within a valid set state (where the possibility of a single programming pulse driving the memory cell into a deep set state is low), and the second set of programming parameters will be selected such that lower voltage programming pulses will be applied when the memory cell is within the "grey zone" (where the possibility of a single programming pulse driving the memory cell into a deep set is higher). However, depending on the needs of a specific application, other differences between the programming parameters may be used to guard against a deep set condition. For example, the series resistance used to apply programming pulses might be increased for memory cells within the "grey zone." In another example, the pulse widths of the programming pulses could be increased (or decreased, depending on the needs of the specific application) for memory cells within the "grey zone."

If process step 830 determined that the memory cell was in a valid set state, the algorithm advances to process step 835a where a programming pulse ($V_P$) is applied to the memory cell according to the first set of programming parameters. This programming pulse ($V_P$) is set to a voltage level of:

$$V_{INIT1}+(\Delta V_1 * i)$$

where:

$V_{INIT1}$=a predetermined initial starting voltage for the reset operation when the memory cell is within a valid set state $\Delta V_1$=a predetermined voltage level scaling factor for the reset operation when the memory cell is within a valid set state i=a counting variable incremented in process step 865a and with a pulse width (PW) of:

$$PW_{INIT1}+(\Delta PW_1 * j)$$

where:

$PW_{INIT1}$=a predetermined initial starting pulse width for the reset operation when the memory cell is within a valid set state $\Delta PW_1$=a predetermined pulse width scaling factor for the reset operation when the memory cell is within a valid set state j=a counting variable incremented in process step 855a After the programming pulse has been applied to the memory cell, a test voltage ($V_T$) is applied to the memory cell in process step 840a. In a next process step 845a, the current through the memory cell ($I_{CELL}$) is observed in order to determine the new resistive state of the memory cell. In a next process step 850a, $I_{CELL}$ is compared against the predetermined set current threshold ($I_{SET}$)—that is, the current value corresponding to the set resistance threshold for the applied test voltage ($V_T$). If $I_{CELL}$ is less than $I_{SET}$, then the algorithm determines that the memory cell is no longer in a valid set state and advances to process step 850c. Otherwise—that is, if $I_{CELL}$ is still greater than or equal to $I_{SET}$, indicating that the memory cell is still in a valid set state—the algorithm advances to the next process step 855a wherein the counting variable j is incremented (effectively increasing the pulse width of the programming pulse for the next cycle), and the programming cycle is continued.

In a next process step 860a, the pulse width set for the next programming pulse—$PW_{INIT1}+(\Delta PW_1 * j)$—is compared against a predetermined maximum pulse width value for the reset operation within a valid set state ($PW_{MAX1}$). If this maximum value has not been exceeded, then the algorithm returns to process step 835a and a new programming pulse is applied. However, if this maximum value has been exceeded—that is, if the next pulse width to be applied is greater than the value of $PW_{MAX1}$—then the algorithm advances to process step 865a.

Within process step 865a, the counting variable "i" is incremented (effectively increasing the voltage level of the programming pulse for the next cycle) and the counting variable j is reset back to zero (effectively returning the pulse width of the programming pulse back to $PW_{INIT1}$ for the next cycle). In a next process step 875a, the voltage level set for the next programming pulse—$V_{INIT1}+(\Delta V_1 *i)$—is compared against a predetermined maximum voltage level for the reset operation within a valid set state ($V_{MAX1}$). If this maximum value has been exceeded—that is, if the voltage level of the next programming pulse to be applied is greater than the value of $V_{MAX1}$—then the algorithm concludes to the RESET OPERATION FAILED process step 880a. However, if this maximum value ($V_{MAX1}$) has not been exceeded, then the algorithm returns to process step 835a and a new programming pulse is applied.

If the algorithm determines that the memory cell is within the grey zone (either at process step 830 or process step 850c), the algorithm advances to process step 835b where a programming pulse ($V_P$) is applied to the memory cell according to the second set of programming parameters. This programming pulse ($V_P$) is set to a voltage level of:

$$V_{INIT2}+(\Delta V_2 *n)$$

where:

$V_{INIT2}$=a predetermined initial starting voltage for the reset operation when the memory cell is within the grey zone $\Delta V_2$=a predetermined voltage level scaling factor for the reset operation when the memory cell is within the grey zone n=a counting variable incremented in process step 865b and with a pulse width (PW) of:

$$PW_{INIT2}+(\Delta PW_2 *m)$$

where:

$PW_{INIT2}$=a predetermined initial starting pulse width for the reset operation when the memory cell is within a valid set state $\Delta PW_2$=a predetermined pulse width scaling factor for the reset operation when the memory cell is within a valid set state m=a counting variable incremented in process step 855b

After the programming pulse has been applied to the memory cell, a test voltage ($V_T$) is applied to the memory cell in process step 840b. In a next process step 845b, the current through the memory cell ($I_{CELL}$) is observed in order to determine the new resistive state of the memory cell. In a next process step 850b, $I_{CELL}$ is compared against the predetermined reset current threshold ($I_{RESET}$)—that is, the current value corresponding to the reset resistance threshold for the applied test voltage ($V_T$). If $I_{CELL}$ is less than $I_{RESET}$, then the algorithm determines that the memory cell is now in a valid reset state and concludes to the RESET OPERATION COMPLETE process step 885. Otherwise—that is, if $I_{CELL}$ is still greater than or equal to $I_{RESET}$—the algorithm advances to the next process step 855b wherein the counting variable m is incremented (effectively increasing the pulse width of the programming pulse for the next cycle), and the programming cycle is continued.

In a next process step 860b, the pulse width set for the next programming pulse—$PW_{INIT2}+(\Delta PW_2 *m)$—is compared against a predetermined maximum pulse width value for the reset operation within the grey zone ($PW_{MAX2}$). If this maximum value has not been exceeded, then the algorithm returns to process step 835b and a new programming pulse is applied. However, if this maximum value has been exceeded—that is, if the next pulse width to be applied is greater than the value of $PW_{MAX2}$—then the algorithm advances to process step 865b.

Within process step 865b, the counting variable n is incremented (effectively increasing the voltage level of the programming pulse for the next cycle) and the counting variable m is reset back to zero (effectively returning the pulse width of the programming pulse back to $PW_{INIT2}$ for the next cycle). In a next process step 875b, the voltage level set for the next programming pulse—$V_{INIT2}+(\Delta V_2 *n)$—is compared against a predetermined maximum voltage level for the reset operation within the grey zone ($V_{MAX2}$). If this maximum value has been exceeded—that is, if the voltage level of the next programming pulse to be applied is greater than the value of $V_{MAX2}$—then the algorithm concludes to the RESET OPERATION FAILED process step 880b. However, if this maximum value ($V_{MAX2}$) has not been exceeded, then the algorithm returns to process step 835b and a new programming pulse is applied.

In this way, a first series of programming pulses will be applied at varying pulse widths and voltage levels when the memory cell is within a valid set state, and a second series of programming pulses will be applied at varying pulse widths and voltage levels when the memory cell is within the grey zone. In this way, specific programming parameters can be selected—dependent on the state of the memory cell at each step within the programming process—such as to prevent a programming pulse from driving the memory cell into deep set.

It should be noted that while the algorithm depicted in FIG. 8 and described in detail above describes a specific process in order to illustrate an exemplary reset operation, the methods of the present invention should not be limited to this specific example. Indeed, it will be clear to those skilled in the art that the reset operation detailed in FIG. 8 could be adjusted in a plurality of ways to optimize a reset operation for a specific application.

For example, within some applications it may be desirable to cycle through a plurality of voltage levels on a programming pulse before increasing pulse width (as opposed to cycling through a plurality of pulse widths before increasing the voltage level, as described in FIG. 8). In other applications, it may be desirable to only vary one parameter (either voltage level or pulse width). In still other applications, it may be desirable to vary other parameters (such as, but not limited to, series resistance and programming pulse rise and fall time) along with or in place of voltage level and pulse width. In still other applications, it may be desirable to apply a range of programming currents of varying magnitude and duration instead of voltage pulses.

It is preferred, then, that the preceding description of an exemplary reset process be representative and inclusive of these variations and not otherwise limited to the specific illustrative parameters detailed.

Figure 9:
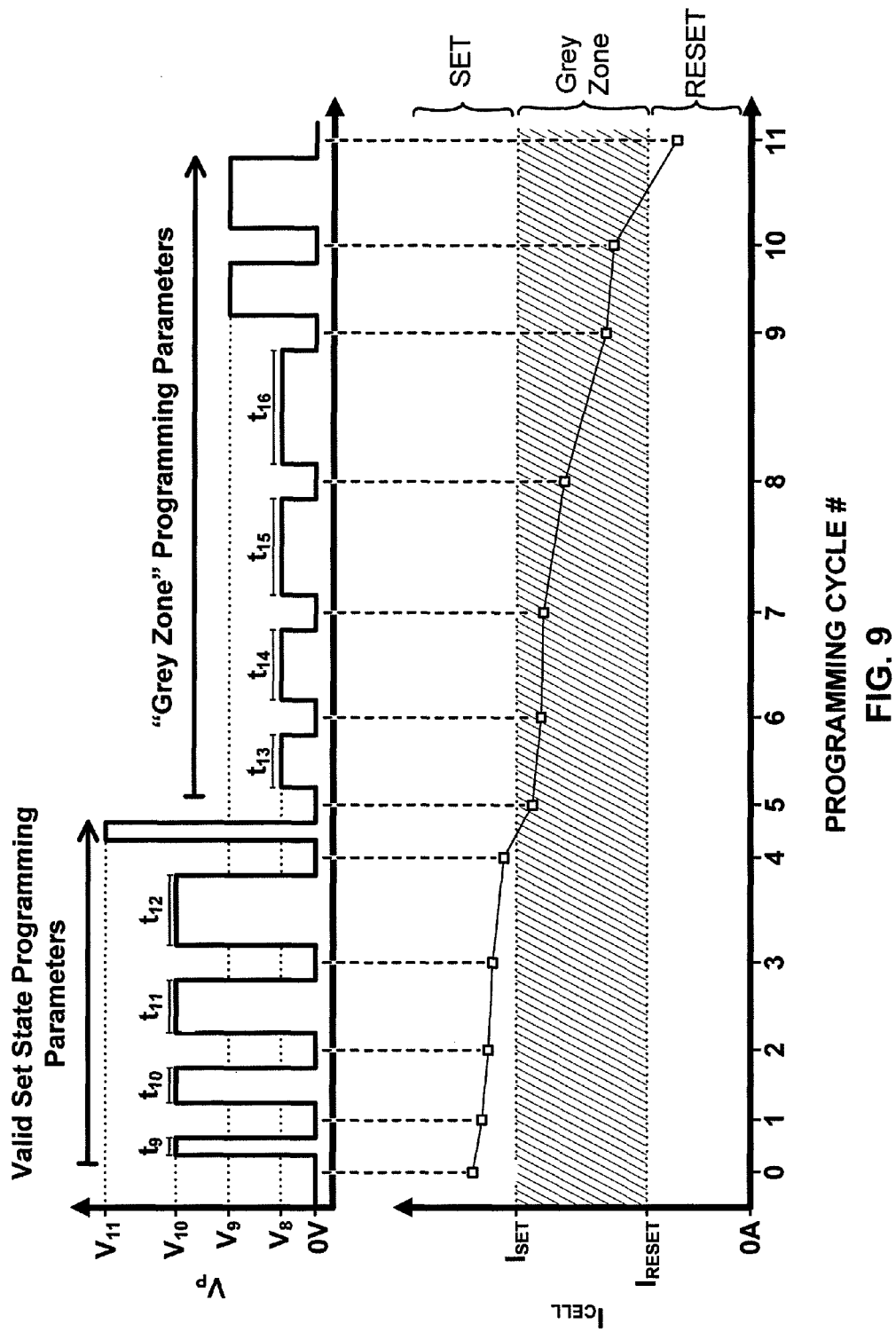
FIG. 9 is a waveform diagram depicting a reset operation performed on a resistive change memory cell according to the algorithm described in FIG. 8.

FIG. 9 is a waveform diagram illustrating the reset operation of a resistive change memory cell according to the algorithm detailed in FIG. 8. The upper waveform diagram in FIG. 9 is a time domain plot of the series of programming pulses ($V_P$) applied to the memory cell as determined by the reset operation algorithm of FIG. 8. The lower waveform diagram in FIG. 9 is a plot of the test currents ($I_{CELL}$) read after each programming pulse is applied. The lower waveform is divided into three horizontal regions. The region between 0A and $I_{RESET}$, wherein a test current ($I_{CELL}$) reading indicates that the memory cell is in a valid reset state. The region above $I_{SET}$, wherein a test current ($I_{CELL}$) reading indicates that the memory cell is in a valid set state. And the region above $I_{RESET}$ and below $I_{SET}$, wherein a test current ($I_{CELL}$) reading indicates that the memory cell is in the "grey zone"—that is, the cell is in neither a valid set nor a valid reset state.

Programming cycle "0" on the horizontal axis of the plot in FIG. 9 corresponds to process step 815 in FIG. 8 (the determination of the initial resistive state of the memory cell before any programming pulses are applied). Programming cycles 1 through 5 on the horizontal axis of the plot in FIG. 9 correspond to process step 845*a* in FIG. 8 (the determination of the new resistive state of the memory cell after each programming pulse is applied according to the first set of programming parameters). Programming cycles 6 through 11 on the horizontal axis of the plot in FIG. 9 correspond to process step 845*b* in FIG. 8 (the determination of the new resistive state of the memory cell after each programming pulse is applied according to the second set of programming parameters).

The voltage levels on the vertical axis of the upper waveform plot ($V_8$-$V_{11}$) in FIG. 9 correspond to the voltage levels ($V_P$) applied in process steps 835*a* and 835*b* in FIG. 8. That is:

$$V_8 = V_{INIT2}$$

$$V_9 = V_{INIT2} + \Delta V_2$$

$$V_{10} = V_{INIT1}$$

$$V_{11} = V_{INIT1} + \Delta V_1$$

The pulse widths indicated on the upper waveform plot ($t_9$-$t_{16}$) in FIG. 9 correspond to the pulse widths (PW) applied in process step 835 in FIG. 8. That is:

$$t_9 = PW_{INIT1}$$

$$t_{10} = PW_{INIT1} + \Delta PW_1$$

$$t_{11} = PW_{INIT1} + (\Delta PW_1 * 2)$$

$$t_{12} = PW_{INIT1} + (\Delta PW_1 * 3)$$

$$t_{13} = PW_{INIT2}$$

$$t_{14} = PW_{INIT2} + \Delta PW_2$$

$$t_{15} = PW_{INIT2} + (\Delta PW_2 * 2)$$

$$t_{16} = PW_{INIT2} + (\Delta PW_2 * 3)$$

The current value, $I_{RESET}$, on the vertical axis of the lower waveform in FIG. 9 corresponds to the threshold current $I_{RESET}$ used in process steps 820, 850*b*, and 850*c* in FIG. 8. The current value, $I_{SET}$, on the vertical axis of the lower waveform in FIG. 9 corresponds to the threshold current $I_{SET}$ used in process steps 830 and 850*a* in FIG. 8. The marked "grey zone" region on the vertical axis of the lower waveform in FIG. 9 indicates the region above the $I_{RESET}$ threshold and below the $I_{SET}$ threshold wherein an $I_{CELL}$ reading indicates that the memory cell is in neither a valid set nor a valid reset state.

Referring now to FIG. 9, at programming cycle 0 a test voltage is applied—prior to the application of any programming pulses—and it is determined that the memory cell is initially in a valid set state. At programming cycle 1, a test voltage is applied after a first programming pulse is applied and shows that $I_{CELL}$ has decreased—which indicates that the resistance of the memory cell has increased. Programming cycles 2-4 show $I_{CELL}$ continuing to decrease—and, thus, the resistance of the memory cell continuing to increase—after each programming pulse applied according to the first set of programming parameters ($V_{INIT1}$, $\Delta V_1$, $V_{MAX1}$, $PW_{INIT1}$, $\Delta PW_1$, and $PW_{MAX1}$). At programming cycle 5, the $I_{CELL}$ reading indicates that the memory cell has entered the grey zone. As can be observed from the upper waveform plot, from this point on programming pulses are applied according to the second set of programming parameters ($V_{INIT2}$, $\Delta V_2$, $V_{MAX2}$, $PW_{INIT2}$, $\Delta PW_2$, and $PW_{MAX2}$), resulting in—within this specific non-limiting example—lower voltage levels and longer pulse widths.

At programming cycle 11—after five additional programming pulses have been applied at increasing pulse widths and voltages according to the second set of programming parameters—$I_{CELL}$ reads below $I_{RESET}$, and the algorithm concludes successfully with the memory cell now in a valid reset state.

It should be noted that the set and reset algorithms described in FIGS. 4, 6, and 8 can be implemented in a plurality of ways. For example, in one embodiment a software controlled programmable power supply can be used to generate the required programming pulses and a software program used to make the comparisons between sensed memory cell current ($I_{CELL}$) and the different set and reset threshold values ($I_{SET}$ and $I_{RESET}$). In another embodiment the algorithm could be realized completely in hardware, with one or more sense amplifiers used to generate the programming pulses, multiplexers and relays used to make the necessary interconnections between the memory cell and other circuit elements, and comparators used to make the comparisons between sensed memory cell current ($I_{CELL}$) and the different set and reset threshold values ($I_{SET}$ and $I_{RESET}$). In another embodiment some combination of hardware and software (such as an analog programming circuit controlled by a microcontroller) may be used to implement the set and reset algorithms. This microcontroller can be on chip (integrated with the programming circuit) or off-chip electrically coupled to the programming circuit.

Figure 10:
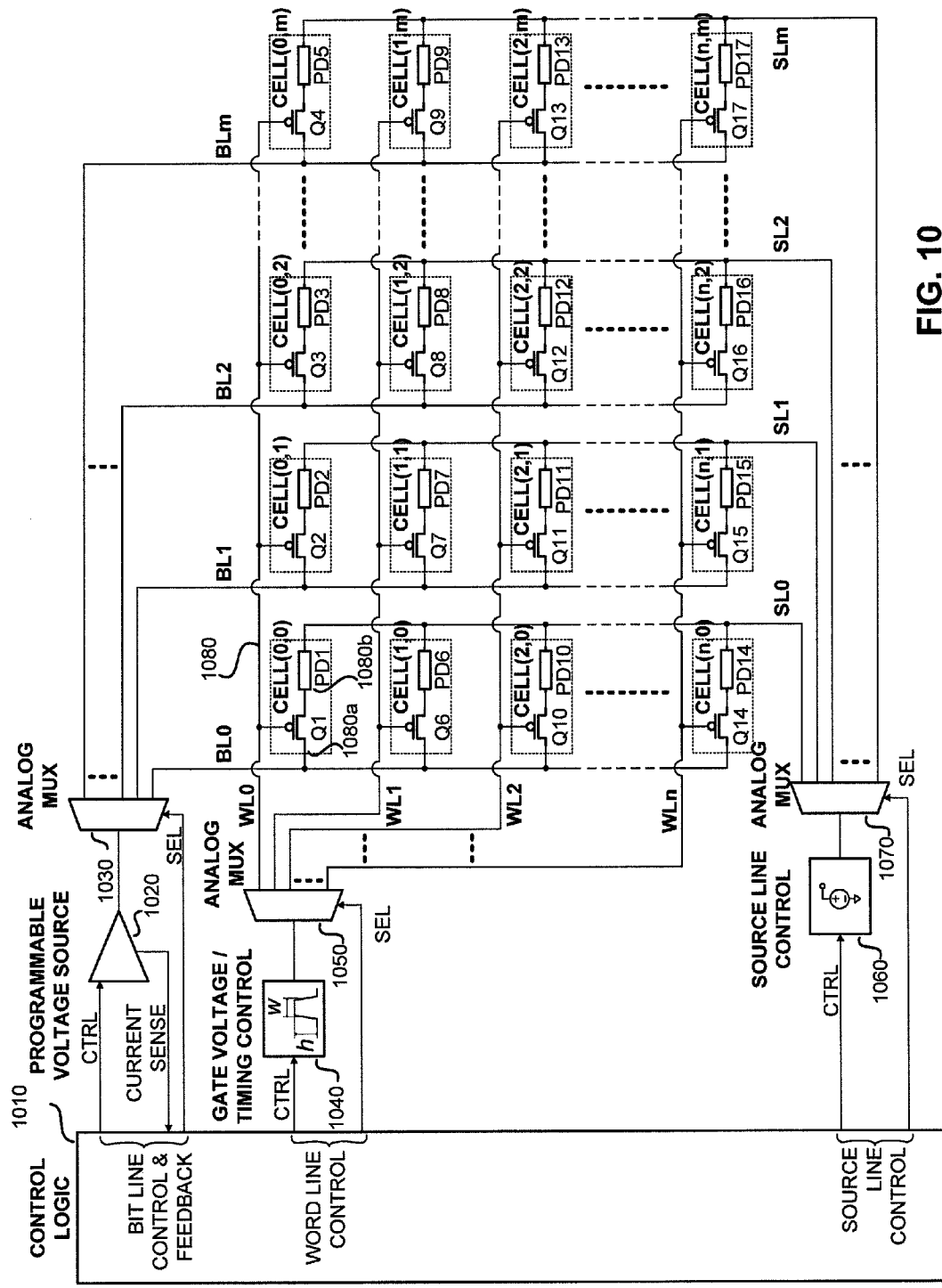
FIG. 10 is a block diagram of an exemplary resistive change memory array including programming and sensing structures well suited for use within the methods of the present disclosure.

FIG. 10 is a block diagram depicting a resistive change memory cell array well suited for use with the methods of the present disclosure. A plurality of resistive change memory cells 1080 are arranged into an array of "m" columns and "n" rows. Each resistive change memory cell 1080 is comprised of a series combination of an FET device 1080*a* and a resistive change memory element 1080*b*, as is detailed in FIGS. 1 and 2 and discussed in detail above.

A first plurality of bit lines (BL0-BLm)—analogous to the bit lines in FIGS. 1 and 2—are run vertically through the array, electrically connecting the drain terminals of the FET devices 1080*a* in each column of memory cells 1080. A second plurality of word lines (WL0-WLn)—analogous to the word lines in FIGS. 1 and 2—are run horizontally through the array, electrically connecting the gate terminals of the FET devices 1080*a* in each row of memory cells 1080. A third plurality of source lines (SL0-SLm)—analogous to the source lines in FIGS. 1 and 2—are run vertically through the array, electrically connecting the second terminal of the resistive change memory elements 1080*b* within each column of memory cells 1080.

A first analog multiplexer 1030, responsive to a selection control from control logic block 1010, electrically couples a voltage provided programmable voltage source 1020 to one of the first plurality of bit lines (BL0-BLm). Programmable voltage source 1020—similar to the programming circuit detailed in FIG. 3A—is responsive to a selection control provided by control logic block 1010 and can be used to provide a plurality of programming pulses and test voltages as described in the discussions of FIGS. 4, 6, and 8. It also includes a current sense feedback line, which provides the control logic block 1010 with a reading for the current being supplied to the selected bit line. As will be show below, this current sense feedback line can be used to measure the cell current ($I_{CELL}$) of a memory cell 1080 being programmed after each programming pulse is applied.

A second analog multiplexer 1050, responsive to a selection control from control logic block 1010, electrically couples a gate control signal (provided by gate voltage/timing control block 1040) to one of the second plurality of word lines (WL0-WLn). Gate voltage/timing control block 1040, responsive to a control signal from control logic block 1010, provides a gate control voltage to a selected word line, allowing the FET device 1080*a* in a selected memory cell to conduct. In some cases—depending on the requirements of the programming parameters being applied—this gate voltage will open the FET device 1080*a* within a selected memory cell completely, essentially electrically coupling the resistive change memory element 1080*b* of the selected memory cell to programmable voltage source 1010. In other cases, this gate voltage will bias the gate of the FET device 1080*a* within a selected memory cell such that the FET device 1080*a* serves to limit the current through resistive change memory element 1080*b*.

A third analog multiplexer 1070, responsive to a selection control from control logic block 1010, electrically couples one of the third plurality of source lines (SL0-SL*m*) to source line control block 1060. Source line control block 1060, responsive to a control signal from control logic block 1010, can be used to either ground or provide an offset voltage to a selected source line. In some cases, it may be desirable to provide an offset voltage on a selected source line such that the effective voltage level of the programming pulse provided the resistive memory change element 1080*b* in a selected memory cell 1080 is reduced.

By providing a programming pulse on a single bit line (selected via first analog multiplexer 1030), a gate voltage on a single word line (selected via second analog multiplexer 1050), and providing a path to ground through—or, alternatively an offset voltage on—a single source line (selected via third analog multiplexer 1070), a single memory cell can be selected and arranged in a programming circuit similar to that detailed in FIG. 3A.

Control logic block 1010 can be implemented through a variety of structures as best fits the needs of a specific application. FPGAs, PLDs, microcontrollers, logic circuits, or a software program executing on a computer could all be used to execute the set and reset algorithms detailed in FIGS. 4, 6, and 8 and provide the necessary control and selection signals discussed above. In this way, the system detailed in FIG. 10 can reliably set and reset any memory cell 1080 within the array using the methods of the present disclosure.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of resetting a resistive change memory element, comprising:
    measuring a current through the resistive change memory element;
    comparing the current through the resistive change memory element with at least one of a first and a second current threshold values, wherein the first and second current threshold values define a first, second, and third current ranges;
    applying stimulus to the resistive change memory element, wherein the stimulus is determined by a first set of programming parameters when the current through the resistive change memory element is within the first current range, and wherein the stimulus is determined by a second set of programming parameters when the current through the resistive change memory element is within the second current range;
    repeating the steps of measuring, comparing, and applying until the current through the resistive change memory element is within the third current range.

2. The method of claim 1 wherein said step of measuring is performed by applying a test voltage across said resistive change memory element.

3. The method of claim 2 wherein said test voltage is applied using a programmable voltage source.

4. The method of claim 3 wherein said programmable voltage source is responsive to a software program.

5. The method of claim 3 wherein said programmable power supply includes a supply current mechanism used to report the current drawn by said resistive change memory element.

6. The method of claim 1 wherein said step of measuring is performed by driving a test current through said resistive change memory element and measuring the resulting voltage across said resistive change memory element.

7. The method of claim 6 wherein said test current is supplied using a programmable current supply.

8. The method of claim 7 wherein said programmable current supply is responsive to a software program.

9. The method of claim 1 wherein the current through said resistive change memory element is measured using an ammeter in series with said resistive change memory element.

10. The method of claim 1 wherein said step of comparing is performed by a software program.

11. The method of claim 1 wherein said step of comparing is performed by a hardware circuit.

12. The method of claim 1 wherein the resistive change memory element is in a valid reset state if the current through the resistive change memory element is within the third current range.

13. The method of claim 1 wherein the programming parameters include at least one of voltage level, pulse width, rise time, fall time, series resistance, and supply current.

14. The method of claim 1 wherein said applying stimulus is performed by a programmable voltage source.

15. The method of claim 14 wherein a software program is used to set said programmable voltage source according to said programming parameters.

16. The method of claim 14 wherein a hardware control circuit is used to set said programmable voltage source according to said programming parameters.

17. The method of claim 1 wherein said applying stimulus is performed by a programmable current supply.

18. The method of claim 17 wherein a software program is used to set said programmable current supply according to said programming parameters.

19. The method of claim 17 wherein a hardware control circuit is used to set said programmable current supply according to said programming parameters.

20. The method of claim 1 wherein said resistive change memory element is a nanotube block switch, said nanotube block switch comprising a first conductive electrode, a second conductive electrode, and a nanotube fabric layer deposed between said first conductive electrode and said second conductive electrode.

21. The method of claim 1 wherein said resistive change memory element is a metal oxide switch, said metal oxide switch comprising a first conductive electrode, a second conductive electrode, and a metal oxide layer deposed between said first conductive electrode and said second conductive electrode.

* * * * *